(12) United States Patent
Kim et al.

(10) Patent No.: US 11,442,118 B2
(45) Date of Patent: Sep. 13, 2022

(54) METHOD FOR SELF-CALIBRATING MULTIPLE FIELD SENSORS HAVING THREE OR MORE SENSING AXES AND SYSTEM PERFORMING THE SAME

(71) Applicant: KOREA INSTITUTE OF SCIENCE AND TECHNOLOGY, Seoul (KR)

(72) Inventors: Ig Jae Kim, Seoul (KR); Je Hyeong Hong, Seoul (KR); Donghoon Kang, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/102,553

(22) Filed: Nov. 24, 2020

(65) Prior Publication Data
US 2022/0120827 A1 Apr. 21, 2022

(30) Foreign Application Priority Data
Oct. 19, 2020 (KR) .................. 10-2020-0135539

(51) Int. Cl.
*G01P 21/00* (2006.01)
*G01R 33/00* (2006.01)
(Continued)

(52) U.S. Cl.
CPC .......... *G01R 33/0041* (2013.01); *G01L 25/00* (2013.01); *G01P 15/18* (2013.01); *G01P 21/00* (2013.01); *G01R 33/0094* (2013.01); *G01R 33/0206* (2013.01)

(58) Field of Classification Search
CPC ............ G01R 33/0041; G01R 33/0094; G01R 33/0206; G01R 33/0035; G01R 3/0017;
(Continued)

(56) References Cited

U.S. PATENT DOCUMENTS

| 9,703,102 B2 | 7/2017 | Hashiba et al. |
| 10,041,795 B2 | 8/2018 | Sekitsuka |

(Continued)

FOREIGN PATENT DOCUMENTS

| CA | 2893009 | * | 6/2014 |
| KR | 10-2015-0022265 A | | 3/2015 |

(Continued)

OTHER PUBLICATIONS

Akiko Mizutani et al., "Semiautomatic calibration and alignment of a low cost, 9 sensor inertial magnetic measurement sensor," Proceeding of SPIE, 2011, vol. 7975, No. 797517.

(Continued)

*Primary Examiner* — Robert R Raevis
(74) *Attorney, Agent, or Firm* — Cantor Colburn LLP

(57) ABSTRACT

Embodiments relate to a method including obtaining m measured values for each field sensor by measuring with respect to a first sensor group including first type of field sensors and a second sensor group including different second type of field sensors, which are attached to the rigid body, at m time steps; and calibrating a sensor frame of the first type of field sensor and a sensor frame of the second type of field sensor by using a correlation between the first type of field sensor and the second type of field sensor based on measured values of at least some of the m time steps, wherein the multiple field sensors include different field sensors of a magnetic field sensor, an acceleration sensor, and a force sensor, and a system therefor.

21 Claims, 14 Drawing Sheets

(51) Int. Cl.
  *G01L 25/00* (2006.01)
  *G01P 15/18* (2013.01)
  *G01R 33/02* (2006.01)

(58) Field of Classification Search
  CPC ....... G01L 25/00; G01L 27/00; G01L 27/002; G01L 27/005; G01P 21/00; G01P 15/18; G01P 21/02
  USPC ........... 73/1.01, 1.03, 1.08, 1.09, 1.15, 1.13, 73/1.38, 1.39, 1.41; 324/200; 702/85, 702/94–96, 98, 101, 104
  See application file for complete search history.

(56) References Cited

U.S. PATENT DOCUMENTS

| | | | |
|---|---|---|---|
| 10,578,403 B2 | 3/2020 | Kapogianis et al. | |
| 2016/0298950 A1* | 10/2016 | Modi | G08B 29/22 |

FOREIGN PATENT DOCUMENTS

| | | | |
|---|---|---|---|
| WO | 2014/164547 | * | 10/2014 |
| WO | 2016/193484 | * | 12/2016 |
| WO | 2020005580 | * | 1/2020 |

OTHER PUBLICATIONS

Chen Wang et al., "A Fast Calibration Method for Magnetometer Array and the Application of Ferromagnetic Target Localization," IEEE Transactions on Instrumentation and Measurement, 2017, pp. 1743-1750, vol. 66, No. 7.

Gorkem Secer et al., "Improvements in deterministic error modeling and calibration of inertial sensors and magnetometers," Sensors and Actuators A, 2016, pp. 522-538, vol. 247, Elsevier B.V.

Konstantinos Papafotis et al., "MAG.I.C.AL.-A Unified Methodology for Magnetic and Inertial Sensors Calibration and Alignment," IEEE Sensors Journal, 2019, pp. 8241-8251, vol. 19, No. 18.

Liu Zongwei et al., "A Low-Cost Calibration Strategy for Measurement-While-Drilling System," IEEE Transactions on Industrial Electronics, 2018, pp. 3559-3567, vol. 65, No. 4.

Manon Kok et al., "Magnetometer Calibration Using Inertial Sensors," IEEE Sensors Journal, 2016, pp. 5679-5689, vol. 16, No. 14.

Manon Kok et al., "Calibration of a magnetometer in combination with inertial sensors," 15th International Conference on Information Fusion, 2012, pp. 787-793.

Marius V. Gheorghe, "Calibration for Tilt-Compensated Electronic Compasses with Alignment Between the Magnetometer and Accelerometer Sensor Reference Frames," IEEE International Instrumentation and Measurement Technology Conference, 2017.

P. Schopp et al., "Self-Calibration of Accelerometer Arrays," IEEE Transactions on Instrumentation and Measurement, 2016, vol. 65, Issue 8.

Xiang Li et al., "Calibration and Alignment of Tri-Axial Magnetometers for Attitude Determination," IEEE Sensors Journal, 2018, pp. 7399-7406, vol. 18, No. 18.

Yan Xia Liu et al., "Novel Calibration Algorithm for a Three-Axis Strapdown Magnetometer," Sensors, 2014, pp. 8485-8504, vol. 14.

Korean Office Action for KR Application No. 10-2020-0135539 dated Jul. 29, 2022.

* cited by examiner

METHOD FOR SELF-CALIBRATING MULTIPLE FIELD SENSORS HAVING THREE OR MORE SENSING AXES AND SYSTEM PERFORMING THE SAME

CROSS-REFERENCE TO RELATED APPLICATION

This application claims priority to Korean Patent Application No. 10-2020-0135539, filed on Oct. 19, 2020, and all the benefits accruing therefrom under 35 U.S.C. § 119, the contents of which in its entirety are herein incorporated by reference.

BACKGROUND OF THE INVENTION

Field of the Invention

The present invention relates to a method for self-calibrating field sensors to be robust against disturbance without using an external special measuring device, when multiple field sensors having three or more sensing axes and outputting different types of measured values are fixed to the same rigid body.

Description of the Related Art

Recently, in order to accurately measure physical quantities of various devices, there is an increasing trend of attempts to utilize field sensors having three or more axes in various devices. As a field sensor that measures a physical quantity composed of three or more axes, there is a force sensor, an acceleration sensor, or a magnetic field sensor. Three-dimensional physical quantities are obtained by the field sensors.

For example, if the force sensor, the acceleration sensor, or the magnetic field sensor having three axes is used, a three-dimensional force vector, a three-dimensional acceleration vector, or a three-dimensional magnetic field vector may be obtained.

However, for the following reasons, when a field sensor having three or more axes measuring a three-dimensional vector is fixed to a rigid body, there is a problem in that a measurement result cannot be directly used.

Skewed Sensing Axis

FIG. 1 is a diagram illustrating an actual sensing axis of a field sensor attached to a rigid body.

As illustrated in FIG. 1, some or all of the actual sensing axes of the field sensor attached to the rigid body are not orthogonal, but are skewed from an orthogonal axis. This is because a strong impact that causes a rapid change in acceleration or a steel/soft iron effect caused by a surrounding strong magnetic material affects the field sensor attached to the rigid body.

Thus, an original measurement result of the field sensor does not represent an accurate three-dimensional vector. For accurate measurement, the degree of skewing of the sensing axis needs to be calculated and corrected. To this end, a virtual orthogonal coordinate system (or referred to as a "sensor frame") that may be arbitrarily defined by a manufacturer or a user is used.

Sensor Frame and Body Frame

A unique sensor frame may be defined for each field sensor measuring a three-dimensional vector. Therefore, if M field sensors (M is a natural number of 2 or more) are fixed to the same rigid body, M sensor frames may exist. Since M field sensors have the skewed sensing axis, each needs to be calibrated with M sensor frames.

In general, a "body frame" may be arbitrarily defined as a common coordinate system having an axis orthogonal to the rigid body attached to M field sensors.

FIG. 2 is a diagram illustrating sensor frames of multiple field sensors attached to the same rigid body.

As illustrated in FIG. 2, virtual sensor frames may be defined for each field sensor having the skewed sensing axis of FIG. 1. Then, two different sensor frames of FIG. 3 may be defined as "sensor frame {a1}" and "sensor frame {a2}", respectively. The common coordinate system may be arbitrarily defined as a "body frame {b}" with reference to the rigid body.

A technique is required, in which M skewed sensing axes are calibrated with each sensor frame based on the body frame.

Calibration Variables of Field Sensor

A three-axis field sensor (e.g., an acceleration sensor) that measures a three-dimensional vector (e.g., an acceleration vector) may be modeled by Equation 1.

$$y_j = Ax_j + b, (j=1, \ldots, M) \quad \text{[Equation 1]}$$

Here, $y_j \in \mathbb{R}^3$ as an output vector of the modeled field sensor is a measured value in a j-th time step of the three-axis field sensor. If the number of measurement times is M, j is any natural number between 1 and M. $x_j$ represents a direction vector of the field sensor. $y_j$ of Equation 1 above is obtained by (i) rotating the three-dimensional field sensor in a predetermined direction and then stopping the three-dimensional field sensor and (ii) measuring the measured value in a stop state. (iii) When the above processes (i) and (ii) are repeated N times, M measured values are obtained.

$A \in \mathbb{R}^{3 \times 3}$ represents an invertible matrix in which a rank is 3 and N represents a time step of measurement. $b \in \mathbb{R}^3$ generally represents a variable referred as a bias or offset vector. When the number of axes of the field sensor is Q (here, Q is a natural number of 4 or more), $y_j \in \mathbb{R}^Q$ and $b \in \mathbb{R}^Q$, $A \in \mathbb{R}^{Q \times 3}$.

In addition, $x_j \in \mathbb{R}^3$ as a three-dimensional vector expressed based on the common coordinate system is a final result value which has a physical unit and is calibrated. A process of obtaining a variable A and a vector b from the measured value $y_j$ of the field sensor is referred to as obtaining a calibration variable. When the calibration variable is used, the sensing axis is calibrated to a sensor frame that outputs the measured value expressed based on the common coordinate system from a sensor frame defined so that the sensing axis is simply orthogonal.

In Non-Patent Document 1 (P. Schopp, "Self-Calibration of Accelerometer Arrays," IEEE Tran. Instrum. Meas., vol. 65, no. 8, 2016), when multiple three-axis acceleration field sensors are attached to the rigid body, an axial direction of the multiple acceleration field sensors is calculated by using a graph optimization technique. However, since it is not possible to prove whether a solution converges, an accurate calibration variable may not be calculated, and as a result, it is difficult to accurately calibrate multiple sensor frames.

It is insignificantly developed to accurately and robustly calibrate multiple sensor frames particularly when multiple different types of field sensors that output different types of measured values are attached to the rigid body (for example, when the magnetic field sensor and the acceleration sensor are attached).

SUMMARY OF THE INVENTION

Embodiments of the present invention may provide a method for self-calibrating field sensors which are robust against outliers due to disturbance without using an external special measuring device when multiple field sensors (e.g., an acceleration sensor, a force sensor, and a magnetic field sensor) having three or more sensing axes and outputting different types of measured values are fixed to the same rigid body, and a system performing the same.

According to an aspect of the present invention, there is provided a method for self-calibrating multiple field sensors attached to a rigid body, which is performed by a processor, the method including: obtaining M measured values for each field sensor by measuring with respect to a first sensor group including first type of field sensors and a second sensor group including different second type of field sensors, which are attached to the rigid body, at M time steps; and calibrating a sensor frame of the first type of field sensor and a sensor frame of the second type of field sensor by using a correlation between the first type of field sensor and the second type of field sensor based on measured values of at least some of the M time steps. The multiple field sensors include different field sensors of a magnetic field sensor, an acceleration sensor, and a force sensor.

In one embodiment, the calibrating of the sensor frame of the first type of field sensor and the sensor frame of the second type of field sensor may include determining pairs of different time steps in the M time steps and obtaining correlations in pairs of multiple time steps; and calculating a relative rotation matrix from one of the first and second types of field sensors to the other field sensor based on the correlations in the pairs of multiple time steps.

In one embodiment, in order to obtain the correlations in pairs of multiple time steps, four time steps may be selected from M time steps to designate independent three pairs of time steps, and the calculating of the relative rotation matrix may include calculating multiple solutions of the relative rotation matrix by applying a nonlinear optimization algorithm to the correlations in the three pairs of time steps; and determining one of the multiple solutions as the relative rotation matrix.

In one embodiment, in order to obtain the correlations in pairs of multiple time steps, nine time steps may be selected from M time steps to designate independent eight pairs of time steps, and the calculating of the relative rotation matrix may include calculating a matrix T through the following Equation of Example 4, which is obtained from the correlations in the eight pairs of time steps; and calculating a solution of the relative rotation matrix based on the calculated value of the matrix T.

$$T \text{vec}(Rm \rightarrow a) = 0$$

or $$T \text{vec}(Ra \rightarrow m) = 0 \quad \text{Equation of Example 4}$$

wherein, $R_{m \rightarrow a}$ represents a relative rotation matrix based on the magnetic field sensor, and $R_{a \rightarrow m}$ represents a relative rotation matrix based on the acceleration sensor or force sensor.

In one embodiment, in order to obtain the correlations in pairs of multiple time steps, 17 time steps are selected from M time steps to designate independent 16 pairs of time steps, and the calculating of the relative rotation matrix may include calculating a variable M associated with a relative rotation matrix by applying measured values in the 16 pairs of time steps to the following Equation of Example 5; and obtaining the relative rotation matrix based on the variable M.

Equation of Example 5

$$(K_a^{-1}(y_{a,j} - b_a))^T R_{m \rightarrow a}(K_m^{-1}(y_{m,j} - b_m)) = \begin{bmatrix} y_{a,j} \\ 1 \end{bmatrix}^T M \begin{bmatrix} y_{m,j} \\ 1 \end{bmatrix} = \cos\theta, \text{ or}$$

$$(K_a^{-1}(y_{a,j} - b_a))^T = R_{a \rightarrow m}(K_m^{-1}(y_{m,j} - b_m)) = \begin{bmatrix} y_{a,j} \\ 1 \end{bmatrix}^T M \begin{bmatrix} y_{m,j} \\ 1 \end{bmatrix} = \cos\theta$$

wherein, ya represents a measured value of the acceleration sensor or the force sensor, ym represents a measured value of the magnetic field sensor, j and k represent different time steps, Km represents an intrinsic variable of the magnetic field sensor, Ka represents an intrinsic variable of the acceleration sensor or the force sensor, and θ represents an angle between a gravity vector direction and an earth's magnetic field vector direction, respectively.

In one embodiment, the calculating of the variable M associated with the relative rotation matrix may include calculating multiple solutions of the variable M by applying a nonlinear optimization algorithm to the correlations in the 16 pairs of time steps; and determining one of the multiple solutions as the variable M, wherein variable M is expressed by the following Equation of Example 6.

Equation of Example 6

$$\begin{bmatrix} y_{a,j} \\ 1 \end{bmatrix}^T M \begin{bmatrix} y_{m,j} \\ 1 \end{bmatrix} - \begin{bmatrix} y_{a,k} \\ 1 \end{bmatrix}^T M \begin{bmatrix} y_{m,k} \\ 1 \end{bmatrix} = 0$$

In one embodiment, the calibrating of the sensor frame of the first type of field sensor and the sensor frame of the second type of field sensor may include obtaining a correlation in each of at least some of M time steps; and calculating a relative rotation matrix from one of the first and second types of field sensors to the other field sensor based on the correlation in each of at least some time steps. The correlation at each time step may be expressed by the following Equation of Example 7.

$$\hat{g}_{a,j}^T R_{m \rightarrow a} \hat{h}_{m,j} - \cos\theta = 0$$

Or $$\hat{h}_{m,j}^T R_{a \rightarrow m} \hat{g}_{a,j} - \cos\theta = 0 \quad \text{Equation of Example 7}$$

wherein, g or h represents gravity and earth's magnetic field vector covering the field sensor, and θ represents an angle between a gravity vector direction and an earth's magnetic field vector direction.

In one embodiment, in order to obtain a correlation at each of at least some of time steps, nine time steps are selected from M time steps, and the calculating of the relative rotation matrix may include calculating a matrix T through the following Equation of Example 8, which is obtained from the correlation in each of 9 time steps; and calculating a solution of the relative rotation matrix based on the calculated value of the matrix T.

$$T \begin{bmatrix} \text{vec}(Rm \rightarrow a) \\ \cos\theta \end{bmatrix} = 0 \quad \text{Equation of Example 8}$$

or $$T \begin{bmatrix} \text{vec}(Ra \rightarrow m) \\ k \end{bmatrix} = 0$$

wherein, $R_{m \to a}$ represents a relative rotation matrix based on the magnetic field sensor, and $R_{a \to m}$ represents a relative rotation matrix based on the acceleration sensor or force sensor.

In one embodiment, in order to obtain a correlation at each of at least some of time steps, 17 time steps are selected from M time steps, and the calculating of the relative rotation matrix may include calculating a variable M associated with the relative rotation matrix by applying measured values in pairs of 17 time steps to the following Equation; and obtaining the relative rotation matrix based on the variable M.

$$\begin{bmatrix} y_{a,j} \\ 1 \end{bmatrix}^T M \begin{bmatrix} y_{m,j} \\ 1 \end{bmatrix} - \cos\theta = 0 \qquad \text{Equation of Example 9}$$

In the exemplary embodiment, the method may further include removing measured values of outlier components. A time step at which measured values of inlier components are measured may be used to obtain the correlation.

In one embodiment, the method may further include updating variables of sensor frames of the multiple field sensors to minimize a difference between an expected value of the sensor frame based on the relative rotation matrix and an actual measured value.

In one embodiment, a new value of the variable to be updated may be calculated through the following Equation of Example 12.

$$\min \sum_{(i,j) \in \Omega_m} \rho\left(\left\|A_i \hat{h}_{m,j} + b_i - y_{ij}\right\|^2\right) + \qquad \text{Equation of Example 12}$$

$$\sum_{(i,j) \in \Omega_a} \rho\left(\left\|A_i \hat{g}_{a,j} + b_i - y_{ij}\right\|^2\right)$$

s.t. $\hat{g}_{a,j}^T R_{m \to a} \hat{h}_{m,f} = \cos\theta$, $\|\hat{g}_{a,j}\| = c_g, \|\hat{h}_{m,j}\| = c_h \forall j$, or $$\min \sum_{(i,j) \in \Omega_m} \rho\left(\left\|A_i \hat{h}_{m,f} + b_i - y_{ij}\right\|^2\right) +$$

$$\sum_{(i,j) \in \Omega_a} \rho\left(\left\|A_i \hat{g}_{a,f} + b_i - y_{ij}\right\|^2\right)$$

s.t. $\hat{h}_{m,j}^T R_{a \to m} \hat{g}_{a,j} = \cos\theta$, $\|\hat{g}_{a,j}\| = c_g, \|\hat{h}_{m,j}\| = c_h \forall j$ wherein, i represents an index of the field sensor included in the corresponding sensor group, A and b represent intrinsic variables of the field sensor, g or h represents a gravity and earth's magnetic field vector covering the field sensor, and θ represents an angle between a gravity vector direction and an earth's magnetic field vector direction, respectively.

In one embodiment, a new value of the variable to be updated may be calculated through a least absolute algorithm, a manifold optimization algorithm, a spherical manifold optimization algorithm, or a Lagrangian method algorithm.

In one embodiment, a combination of the first type of field sensor and the second type of field sensor may include a three-axis magnetic field sensor and a three-axis acceleration sensor, a three-axis magnetic field sensor and a three-axis force sensor, or a three-axis force sensor and a three-axis acceleration sensor.

In one embodiment, the method may further include calculating a sensor frame of the first sensor group or the second sensor group by calibrating the sensor frame for each field sensor. The sensor frame of the first type of field sensor or the sensor frame of the second type of field sensor to be calibrated may be a sensor frame of the first sensor group or the second sensor group.

In one embodiment, when the first sensor group or the second sensor group consists of multiple three-axis field sensors, the calculating of the sensor frame of the first sensor group or the second sensor group includes calculating calibration variables A and b for each field sensor using at least some of the M measured values to calibrate the sensor frame for each field sensor in the corresponding sensor group, wherein the calculating of the calibration variables A and b for each field sensor may include calculating multiple intrinsic variables including the calibration variable b based on at least some of the M measured values; calculating extrinsic variables including a rotation matrix R based on at least some of the M measured values; and calculating the calibration variable A based on the intrinsic variable and the extrinsic variable.

In one embodiment, the calculating of the multiple intrinsic variables may include removing measured values of outlier components from the M measured values; and calculating an intrinsic variable including the variable b based on the measured values of inlier components. The intrinsic variable may include a sub-matrix K or P of the calibration variable A that satisfies the following Equation of Example 17, and the intrinsic variable K may be a matrix in a positive definite upper triangular form, and the intrinsic variable P may be a matrix in a symmetric positive definite form.

$A = KR$ or $A = PR$ \qquad Equation of Example 17 wherein, R represents a rotation matrix as an extrinsic variable of the field sensor.

In one embodiment, the calculating of the extrinsic variables based on at least some of the measured values may include calculating a relative rotation matrix of sensor pairs by forming the sensor pairs in the sensor group to calculate a relative direction between the sensor frames in the sensor group; and calculating an absolute rotation matrix for each field sensor to calculate each absolute direction of each sensor frame of an individual sensor in the sensor group. The absolute rotation matrix is an extrinsic variable R.

In one embodiment, when the first sensor group or the second sensor group consists of field sensors having Q axes (wherein, Q is a natural number of 4 or more), the calculating of the sensor frame of the first sensor group or the second sensor group may include calculating calibration variables A and b for each field sensor using at least some of the M measured values to calibrate the sensor frame for each field sensor in the corresponding sensor group. The calculating of the calibration variables A and b for each field sensor may include: obtaining a vector b as an intrinsic variable; calculating a matrix A by applying a rank-4 matrix decomposition algorithm to a measurement matrix Y consisting of the measured values; and calibrating the obtained variables A and b values so that the size of a direction vector is as close as possible to a specified value c in the sensor frame including the obtained variables A and b. The vector b is designated as an arbitrary vector, and the value c is a size value of a unit vector of the direction vector of the field sensor.

According to another aspect of the present invention, there is provided a computer-readable recording medium in which computer programs are recorded to perform the method according to the embodiments described above.

According to yet another aspect of the present invention, there is provided a system including: multiple field sensors outputting M measured values by measuring at M time steps and including a first type of field sensor and a different second type of field sensor which are attached to rigid bodies; and a computing device including a processor. The computing device is configured to obtain M measured values from each of the multiple field sensors and to calibrate a sensor frame of the first type of field sensor and a sensor frame of the second type of field sensor using a correlation between the first type of field sensor and the second type of field sensor. The multiple field sensors include different field sensors of a magnetic field sensor, an acceleration sensor, and a force sensor.

BRIEF DESCRIPTION OF THE DRAWINGS

In order to more clearly describe the technical solutions of the embodiments of the present invention or the related art, the drawings required for the description of the embodiments will be briefly introduced below. It is to be understood that the following drawings are just for describing the embodiments of the present specification, not for the purpose of limitation. In addition, some elements to which various modifications such as exaggeration and omission are applied will be illustrated in the following drawings for clarity of description.

DETAILED DESCRIPTION OF THE PREFERRED EMBODIMENTS

Terms used in the present application are used only to describe specific embodiments, and are not intended to limit the present invention. A singular form may include a plural form unless otherwise clearly indicated in the context. In this specification, the terms such as "comprising" or "having" are intended to specify features, regions, numbers, steps, operations, elements, and/or components to be described, and does not exclude presence or addition of one or more other specific features, regions, numbers, steps, operations, elements, and/or components.

If it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present specification.

Hereinafter, embodiments of the present invention will be described in detail with reference to the accompanying drawings.

A method of self-calibrating one or more field sensors according to embodiments of the present invention (hereinafter, referred to as a "self-calibration method") is to self-calibrate a field sensor having three or more axes attached to the same rigid body.

Figure 1:
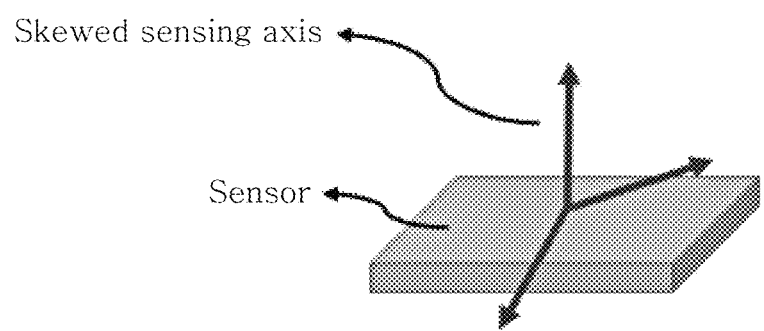
FIG. 1 is a diagram illustrating an actual sensing axis of a field sensor attached to a rigid body.
Figure 2:
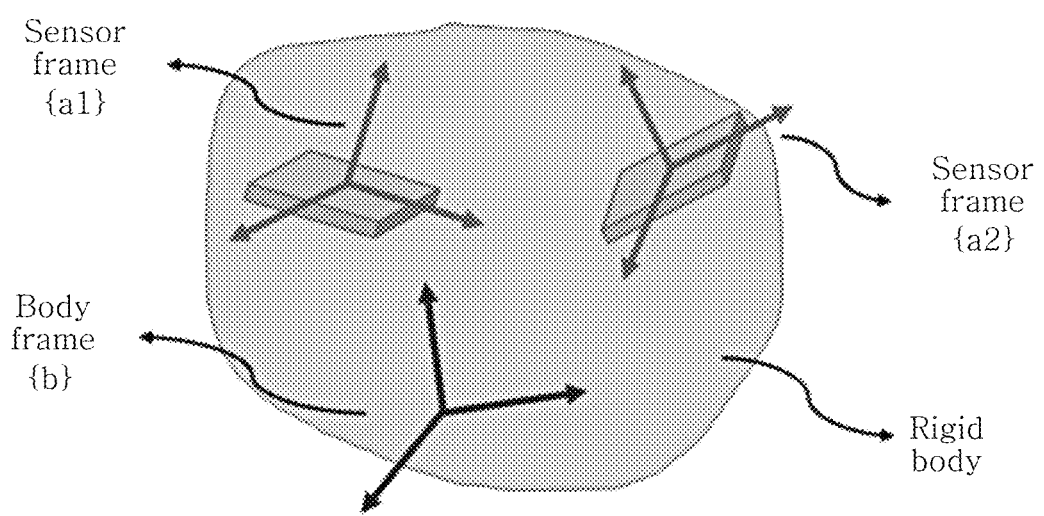
FIG. 2 is a diagram illustrating a sensor frame of multiple field sensors attached to the same rigid body.
Figure 3:
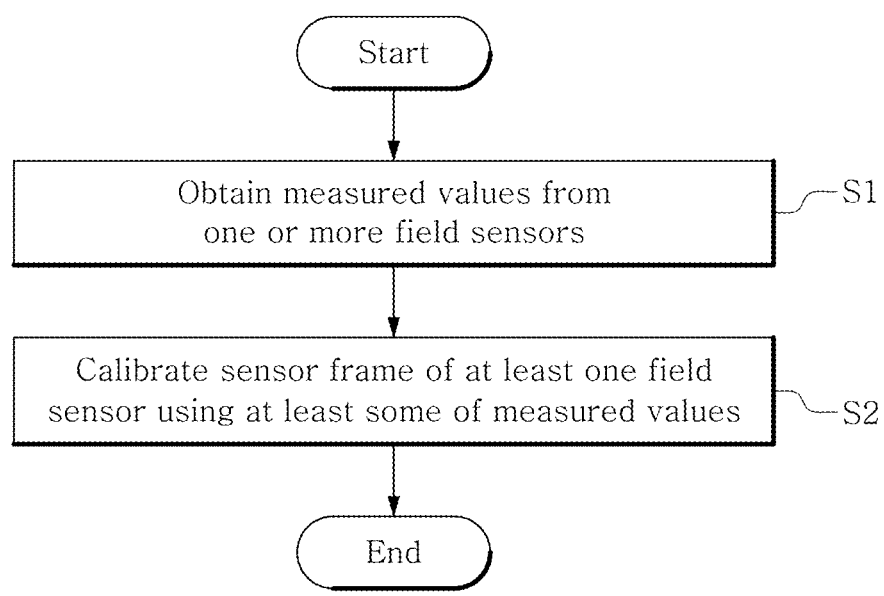
FIG. 3 is a flowchart of a self-calibration method according to an embodiment of the present invention.

FIG. 3 is a flowchart of a self-calibration method according to an embodiment of the present invention.

Referring to FIG. 3, the self-calibration method includes: obtaining measured values of each field sensor from multiple field sensors (S1); and calibrating a sensor frame of the at least one field sensor using at least some of the measured values (S2).

The field sensor has three or more axes. The field sensor may be a force sensor, an acceleration sensor, or a magnetic field sensor. The force sensor and the acceleration sensor output an acceleration vector, and the magnetic field sensor outputs a magnetic field vector.

A sensor coordinate system of the field sensor may be expressed as an intrinsic variable and/or an extrinsic variable. The internal/extrinsic variables of the sensor are different from internal/extrinsic variables of a device commonly used in a camera.

The extrinsic variable of the sensor is a variable that is affected by a posture of the sensor (i.e., a posture of an object to which the sensor is attached). For example, the extrinsic variable of the sensor may be a rotation matrix.

The intrinsic variable of the sensor is a variable that is not significantly affected by the posture of the object (e.g., a rigid body such as a board) to which the sensor is attached. For example, the intrinsic variable of the magnetic field sensor is a variable which is mainly affected by a steel/soft iron effect, a scale, and a bias. The intrinsic variable of the acceleration sensor is a variable which is mainly affected by a scale and a bias.

A calibration variable for the sensor frame includes any one of an intrinsic variable and/or an extrinsic variable, or a variable having an intrinsic variable and/or an extrinsic variable as a sub-variable. For example, a calibration variable A has an intrinsic variable K (or P) and an extrinsic variable R, which will be described below, as sub-variables. A calibration variable b is an intrinsic variable.

These calibration variables are calculated according to a combination of the number of field sensors fixed to the rigid body and/or the number of axes.

Figure 4A:
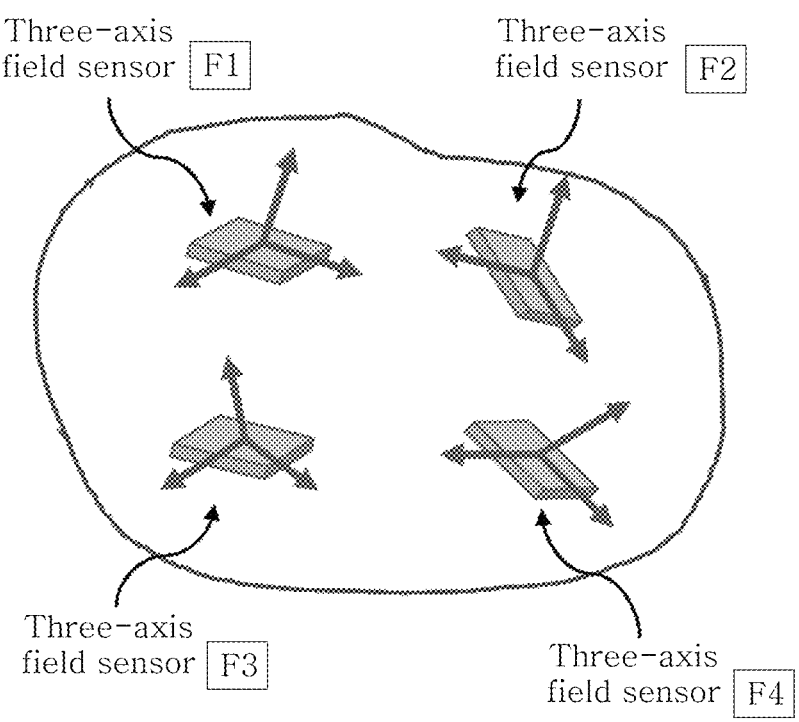
FIGS. 4A to 4C are diagrams illustrating first to third types of sensor groups attached to rigid bodies according to various embodiments of the present invention, respectively.
Figure 4B:
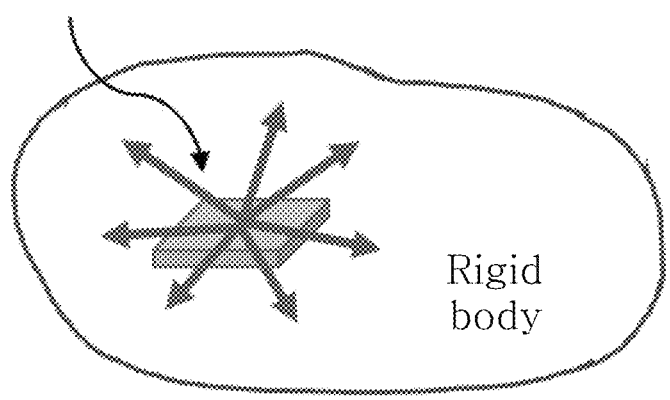
Figure 4C:
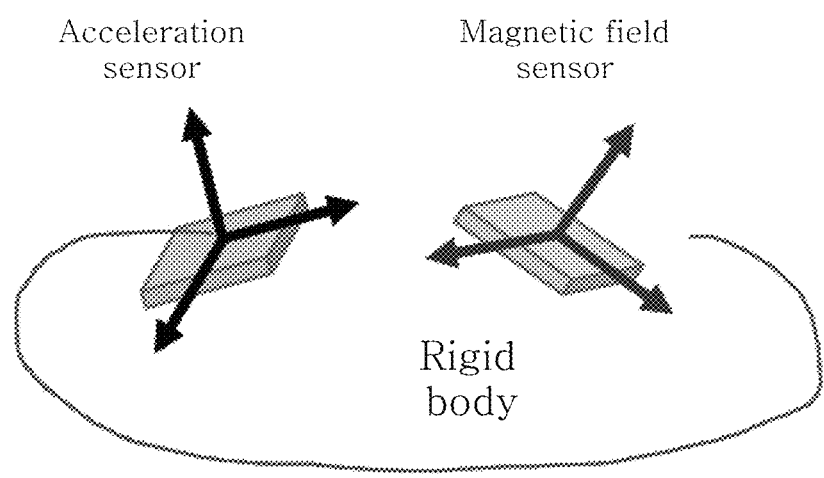

FIG. 4A is a diagram illustrating a first type of sensor group, and FIG. 4B is a diagram illustrating a second type of sensor group. FIG. 4C is a diagram illustrating a form of a third type of sensor group.

Referring to FIG. 4A, a first type of sensor group may be attached to the rigid body. The first type of sensor group includes multiple field sensors, and each of the multiple field sensors is a three-axis field sensor that outputs the same type of three-dimensional vector. For example, the first type of sensor group may consist of multiple three-axis acceleration sensors, multiple three-axis force sensors, multiple three-axis acceleration sensors, or one or more three-axis force sensors and one or more three-axis acceleration sensors, or multiple three-axis magnetic field sensors.

When the first type of sensor group of FIG. 4A is attached to the rigid body, the same type of measured value is obtained from individual field sensors in the sensor group (S1). The calibration variables of the individual field sensors are calculated using the measured values of the sensor group (S2). The calculation process (S2) of the calibration variable for the first type of sensor group will be described in more detail with reference to FIG. 5.

Referring to FIG. 4B, a second type of sensor group may be attached to the rigid body. The second type of sensor group includes field sensors having at least four axes. The second type of sensor group may consist of single field sensors having at least four axes. For example, the second type of sensor group may consist of an acceleration sensor, a force sensor, or a magnetic field sensor having four or more axes.

When the second type of sensor group of FIG. 4B is attached to the rigid body, measured values are obtained from single field sensors in the sensor group (S1). The calibration variables of the field sensors are calculated using the measured values of the sensor group (S2). The calculation process (S2) of the calibration variable for the second type of sensor group will be described in more detail with reference to FIG. 6.

As such, the first type of sensor group and the second type of sensor group are classified according to the number of sensing axes. In addition, the first type and second type of sensor groups and the third type of sensor group are distinguished according to whether or not the field sensors in the group output the same type of field vector.

As illustrated in FIG. 4C, the third type of sensor group includes multiple field sensors.

The third type of sensor group includes different types of three-axis field sensors that measure a three-axis field vector. Here, the different kinds of measured values mean that spatial vectors to be measured (e.g., two different reference vectors: gravity and geomagnetic field) are different.

For example, the third type of sensor group according to an embodiment may include a three-axis magnetic field sensor and a three-axis acceleration sensor, or a three-axis magnetic field sensor and a three-axis force sensor, which measure gravity and earth's magnetic field vectors, respectively. In addition, the third type of sensor group may include a three-axis force sensor and a three-axis acceleration sensor.

The calculation process (S2) of the calibration variable for the third type of sensor group will be described in more detail with reference to FIGS. 7 and 8.

Self-Calibration of First Type of Sensor Group

Figure 5:
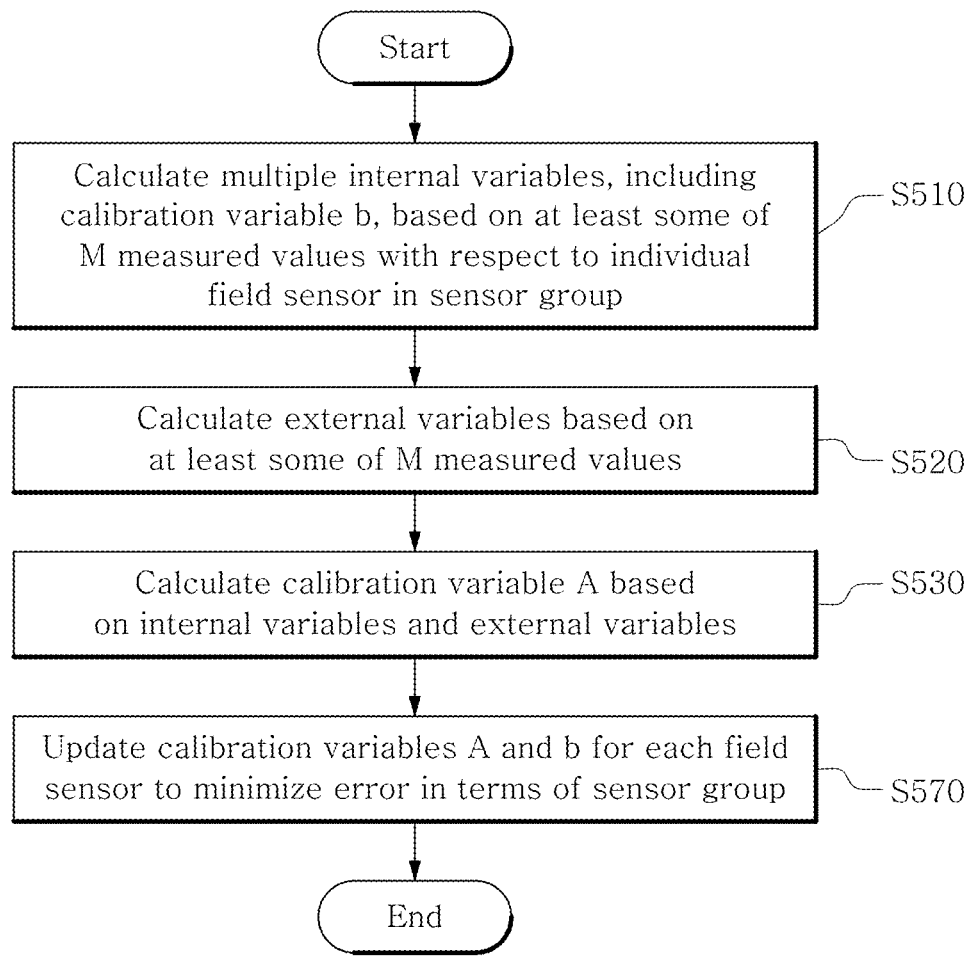
FIG. 5 is a flowchart of a process of calibrating a sensor frame of each field sensor in a first type of sensor group according to an embodiment of the present invention.

FIG. 5 is a flowchart of a process of calibrating a sensor frame of each field sensor in a first type of sensor group according to an embodiment of the present invention.

Referring to FIG. 5, the calibrating (S2) of the sensor frame of at least one field sensor using at least some of the measured values includes, when the first type of sensor group is attached to the rigid body, calibrating the sensor frame of each field sensor in the first type of sensor group.

The calibrating (S2) of the sensor frame of each field sensor in the first type of sensor group includes: calculating multiple intrinsic variables including a calibration variable b based on at least some of the M measured values (S510); calculating an extrinsic variable based on at least some of the M measured values (S520); and calculating a calibration variable A based on the intrinsic variable and the extrinsic variable (S530). The calibration variables of step S2 in the first type of sensor group include A and b. In specific embodiments, the multiple intrinsic variables of step S510 may include variables K (or P) and b. The extrinsic variable in step S520 may be a rotation matrix R. The variables will be described in more detail below.

The three-axis field sensor may measure a three-dimensional field (e.g., gravity or geomagnetic field) in a standing state. If the measurement of the three-dimensional field is repeated M times in a stationary state while changing the direction of the field sensor, M measured values are obtained (S1).

The M measured values are measured values obtained by being measured M times by a single field sensor. If the number of field sensors in the first type of sensor group is N, N×M measured values are obtained (S1).

In the field sensor modeled by Equation 1 above, the measured values are mathematically located on an ellipsoid surface, and the M measured values for each field sensor may include measured values of outlier components due to disturbance and the like. Relatively inaccurate calibration variables are calculated if all measured values, including measured values corresponding to the outlier components, are used as they are. In the process (S2) of FIG. 5, even when the measured values of the outlier components exist, relatively accurate calibration variables may be calculated.

In one embodiment, the step S510 includes: removing the measured values of the outlier components (S511); and calculating an intrinsic variable including the variable b based on the measured values of the inlier components (S513). In step S513, multiple variables including the variable b may be obtained.

Based on the M measured values obtained by individual field sensors in the sensor group, an inlier area is set based on the set inlier area, the measured values of the outlier components are determined, and the measured values of the outlier components are removed to extract measured values of the inlier components (S511). Here, the measured values of the outlier components are measured values located outside the inlier area.

An algorithm for setting the inlier area includes, for example, a RANSAC algorithm or a robust kernel algorithm. The robust kernel algorithm may be, for example, L1, L2, maxnorm, Huber, Cauchy, German-and-McClure, etc., but is not limited thereto.

The Random Sample Consensus (RANSAC) algorithm is a robust optimization method for outlier data, and randomly extracts only the minimum data required to model a target model from multiple samples. For example, in order to model linear equation lines from multiple point data, the RANSAC extracts two minimum point data. In the above example, the RANSAC generates a linear equation model from the extracted minimum data, calculates how many point data are distributed closely to the linear equation model based on the corresponding model, and determines a model in which the point data is distributed closest to the corresponding model based on the distribution, as the optimal model.

By setting such an inlier area, overfitting does not occur even when measured values are obtained on a small scale or irregularly distributed measured values are obtained, so that a sensor frame that is robust against noise and perturbation may be modeled.

$AA^T$ is calculated by applying an ellipsoid fitting algorithm to the measured values of the inlier components. A specific method of performing the ellipsoid fitting algorithm is disclosed in Korean Patent Registration No. 10-1209571 by the inventors of the present disclosure and cited.

When the measured values of the inlier components are applied to the ellipsoid fitting algorithm, variables $AA^T$ and b are obtained. However, for self-calibration, the variable A also needs to be obtained. The calibration variable A consists of an intrinsic variable K (or P) and an extrinsic variable R, which are different from those of the variable b.

In one embodiment, the calibration variable A, which is an invertible matrix, may be expressed by Equation 2 below. The intrinsic variable K is calculated through Equation 2 (S513).

$$A=KR \qquad \text{[Equation 2]}$$

Here, $K \in \mathbb{R}^{3 \times 3}$ is an intrinsic variable and is a triangular matrix with an inverse matrix. The matrix K is a positive definite matrix having 3×3 components. R is a rotation matrix. The rotation matrix R is an orthogonal matrix.

In some embodiments, a matrix K in a positive definite upper triangular form may be applied to Equation 2. For example, the matrix K constituting a calibration matrix A of the first type of sensor group may have a form of the following internal structure and components:

$$K = \begin{bmatrix} a & b & c \\ 0 & d & e \\ 0 & 0 & f \end{bmatrix} \text{ or } \begin{bmatrix} a & 0 & 0 \\ b & d & 0 \\ c & e & f \end{bmatrix} \text{ or } \begin{bmatrix} a & b & 0 \\ 0 & d & 0 \\ c & e & f \end{bmatrix} \text{ or } \begin{bmatrix} a & 0 & 0 \\ 0 & d & b \\ c & e & f \end{bmatrix}.$$

The matrix K is formed by designating signs of components in diagonal components according to a predetermined rule. The matrix K is formed of components in which, for example, all of the diagonal components have positive numbers or have negative numbers, or specific components have positive numbers and the remaining components have negative numbers. Since the matrix K has such an internal component and/or internal structure, a result obtained by multiplying the number of diagonal components in the matrix K by the rotation matrix R has a positive sign.

In the four exemplary forms above, when the matrix K is a matrix of the first form, the measurement model indicates that a y-axis and an x-axis are skewed and scaled with respect to a z-axis. When the matrix K is a matrix with the second form, the measurement model indicates that the y-axis and the z-axis are skewed and scaled with respect to the x-axis. When the matrix K is a matrix with the third form, the measurement model indicates that the x-axis and the z-axis are skewed and scaled with respect to the y-axis. When the matrix K is a matrix with the fourth form, the measurement model indicates that the x-axis and the z-axis are skewed and scaled with respect to the y-axis.

When A satisfies Equation 2 above (i.e., A=KR), $AA^T=KK^T$. Using a decomposition algorithm, a unique K may be calculated from $AA^T$ (S513). The decomposition algorithm for calculating K is an algorithm used for decomposition of a positive definite matrix, and may include, for example, Cholesky decomposition, but is not limited thereto. When the decomposition algorithm is applied, a decomposition result expressed by the product of a lower triangular matrix and a conjugate transposed matrix of the lower triangular matrix is obtained.

In another embodiment, the calibration variable A, which is an invertible matrix, may be expressed by Equation 3 below. The intrinsic variable P is calculated through Equation 3 (S513).

$$A=PR \qquad \text{[Equation 3]}$$

Here, $P \in \mathbb{R}^{3 \times 3}$ is a symmetric matrix. The matrix P represents the skew and scale of the axis. R is a rotation matrix. The rotation matrix R is an orthogonal matrix.

In some embodiments, a matrix P in a symmetric positive definite form may be applied to Equation 3. For example, the matrix P constituting a calibration variable A of the first type of sensor group may have a form of the following internal structure and components:

$$P = \begin{bmatrix} a & b & c \\ b & d & e \\ c & e & f \end{bmatrix}.$$

The matrix P is formed by designating signs of components in diagonal components according to a predetermined rule. The matrix P is formed of components in which, for example, all of the diagonal components have positive numbers or have negative numbers, or specific components have positive numbers and the remaining components have negative numbers.

The matrix P with the exemplary internal structure and components above indicates that each axis is skewed and scaled from any reference axis.

When A satisfies Equation 3 above (i.e., A=PR), $AA^T=PP^T$. Using a decomposition algorithm, a unique P may be calculated from $AA^T$ (S513). The decomposition algorithm for calculating P is a matrix capable of eigen decomposition for a symmetric matrix, and may include, for example, singular value decomposition, but is not limited thereto.

Optionally, step S510 may include: updating the variable b in step S511 and the variable K (or P) in step S513 to be robust against disturbance (S515). In this case, the values of the variable b in step S511 and the variable K in step S513 are used as initial values, and the variable b and/or K (or P) consisting of the initial values is refined, so that the variables b and K or P robust against disturbance are calculated.

Hereinafter, for clarity of explanation, step S515 will be described in more detail as an embodiment in which the variable K is calculated using Equation 2 in step S513.

The variables K and b in steps S511 and S513 are designated as initial values, and K and b that are robust against disturbance may be calculated through Equation 4 below.

$$\min_{(i,j) \in \Omega} \sum \rho\left(\|K_i \hat{x}_j + b_i - y_{ij}\|^2\right) \text{ s.t. } \|\hat{x}_j\| = c \,\forall\, j \qquad \text{[Equation 4]}$$

Here, $\Omega$ denotes a set of measured values observed by the group of sensors, wherein i denotes a sensor, and j denotes a detection time step of the corresponding measured value. When the first type of sensor group includes N sensors, i is a natural number between 1 and N. If the number of measurement is M times, j is a natural number between 1 and M. $y_{ij}$ is a measured value measured by an i-th field sensor at a j-th measurement number. $\rho(\bullet)$ is a robust kernel function. The robust kernel function may be, for example, Huber, Cauchy, or Geman-McClure.

The size of a unit vector with respect to a direction vector of the field sensor is designated as an arbitrary constant c. For example, the size c of the direction vector may be 1, but is not limited thereto.

New values for variables K and b are calculated through Equation 4 to minimize a difference between a predicted value of the field sensor consisting of the initial variables K and b in steps S511 and S513 and an actual measured value. Then, the value of the variable b obtained in step S511 and the value of the variable K obtained in step S513 are updated to values obtained in step S515, respectively. The updated variables K and b are used as calibration variables or used to calculate calibration variables.

In another embodiment, since the process of updating the variable P in step S530 is similar to the process of updating the variable K described above, a detailed description thereof will be omitted.

In one embodiment, the step S520 includes: calculating a relative direction between sensor frames in the sensor group (S523); and calculating the absolute directions of the sensor frames of the individual sensors in the sensor group, respectively (S525).

In order to calculate the relative direction between the sensor frames, sensor pairs may be selected from the first type of sensor group, and a relative rotation matrix for the sensor pairs may be calculated (S523). In step S523, one or more sensor pairs are selected.

The sensor pair consists of different sensors. A set of sensor pairs to be selected includes all sensors in the group.

In some embodiments, the formation of sensor pairs is repeated until all field sensors in the group have been selected. When there are overlapped sensor pairs, a relative rotation matrix is calculated for only one of the overlapped sensor pairs. As illustrated in FIG. 4, when the first type of sensor group includes four sensors, four relative rotation matrices are calculated.

The relative rotation matrix may be calculated through various relative rotation matrix calculation algorithms. The relative rotation matrix calculation algorithm may include, for example, an algorithm that calculates a solution for solving a Wahba problem (e.g., a TRIAD algorithm) or a Dot product invariance algorithm. Through this algorithm, a relative rotation matrix for each sensor pair may be calculated.

In one example, by calculating a solution for solving the Wahba problem using measured values of two sensors in a pair, a relative rotation matrix for two sensors in a pair is calculated.

In step S525, an absolute rotation matrix for each field sensor is calculated. The absolute rotation matrix is used as the variable R in Equations 2 and 3.

The absolute direction is set based on a pre-designated common coordinate system. The common coordinate system may be a body coordinate system. However, the present invention is not limited thereto, and a sensor coordinate system of any field sensor in the sensor group may be set as a common coordinate system.

The absolute rotation matrix calculated in step S525 represents a correlation between the individual sensor frames of the field sensors in the sensor group and the common coordinate system of the sensor group.

In one embodiment, the absolute rotation matrix for each sensor may be calculated by applying the relative rotation matrix to a graph optimization algorithm (S525). The graph optimization method may be, for example, a minimum spanning tree method, but is not limited thereto.

In another embodiment, the absolute rotation matrix for each field sensor may be calculated by applying the relative rotation matrix calculated in step S523 to a rotation averaging algorithm (S525).

However, the acquisition of the absolute rotation matrix is not limited by the above algorithm, and the absolute rotation matrix may be calculated from a set of relative rotation matrices using various algorithms.

A calibration variable A is calculated based on the rotation matrix in step S525 as the extrinsic variable of the field sensor and the intrinsic variable K (or P) in step S510 as the intrinsic variable of the field sensor (S530). The calibration variable A is calculated through Equation 2 or 3.

Optionally, step S520 may further include: removing the measured values of the outlier components from the measured values of two field sensors making a sensor pair (S521) before applying the measured values of two field sensors making a sensor pair to a graph optimization algorithm, a rotating average algorithm, or the like to calculate the relative rotation matrix of the sensor pair. Then, the relative rotation matrix is calculated using the measured values of the inlier components extracted in step S521, and eventually, the absolute rotation matrix based on the measured values of the inlier components is calculated (S525). The relative rotation matrix of the outlier components may be removed through a RANSAC algorithm or the like. The process of removing the measured values of the outlier components is described above, and a detailed description thereof will be omitted.

Steps S510 to S530 are performed for all field sensors in the first type of sensor group. For example, with respect to N field sensors included in the sensor group, an absolute rotation matrix for each sensor is calculated based on the relative rotation matrix calculated for each field sensor.

Then, all field sensors in the first type of sensor group are self-calibrated to the common coordinate system. Then, the measured values of the field sensors in the first type of sensor group are expressed as the common coordinate system.

Optionally, step S2 may further include updating the calibration variables A and/or b of the field sensor to minimize an error of the sensor group side (S570).

New values of the variables K (or P), R, and b of the field sensor may be calculated through a nonlinear optimization algorithm (S570). The nonlinear optimization algorithm includes a least square algorithm, a least absolute algorithm, a manifold optimization algorithm, a spherical manifold optimization algorithm, a constraint optimization ((augmented) Lagrangian method, etc.) algorithm, etc., but is not limited thereto.

In one example, after the variable K is calculated in step S510, when the least square algorithm is used as the nonlinear optimization algorithm, $K_i$, $R_i$, and $b_i$ of the i-th field sensor in the sensor group are calculated through Equation 5 below.

$$\min \sum_{(i,j) \in \Omega} \rho(\|K_i R_i \hat{x}_j + b_i - y_{ij}\|^2) \text{ s.t. } \|\hat{x}_j\| = c \forall j \quad \text{[Equation 5]}$$

Here, x̂ is a unit vector of the field sensor, as a unit vector obtained by normalizing a field vector X expressed based on the common coordinate system, and is calculated using M measured values. The size of the unit vector may be designated as an arbitrary value c. In the case of a magnetic field sensor, the size of an earth's magnetic field vector may be $c_h$, and in the case of the acceleration sensor or the force sensor, the size of a gravity vector may be $c_g$.

Variables of all the field sensors in the sensor group are adjusted in a direction of solving the minimization of the square error of Equation 5 (S570). The size of the unit vector of a direction vector of the field sensor is used as constraints for optimization.

Variables of all the field sensors in the sensor group are adjusted in a direction of solving the minimization of the square error of Equation 7 (S570). New values of the calibration variables A and b are obtained to minimize an error obtained by calculating the error between the expected value by the sensor frame and the actual measured value with respect to all field sensors in the sensor group.

The sensor frame for each field sensor is re-updated with the new value calculated through Equation 5. Due to the adjustment of these variables, the optimization operation of minimizing the error is completed in terms of the sensor group.

Even when the first type of sensor group is attached to the rigid body through the above-described step (S2), the self-calibration operation robust against disturbance may be performed by removing the outlier components and/or minimizing errors while not requiring a separate measuring device or the like.

In particular, when multiple field sensors of the first type of sensor group are attached to the same rigid body, there is an advantage of measuring a physical quantity that may not be measured by a single field sensor. Specifically, if multiple acceleration sensors are attached to the same rigid body, it is possible to measure "angular acceleration" of the rigid body.

Alternatively, if multiple magnetic field sensors are fixed to the same rigid body, there is an advantage of being used to detect magnetic objects or conductive objects (e.g., vehicles) and accurately calculate a position, a direction, etc.

Self-Calibration of Second Type of Sensor Group

Figure 6:
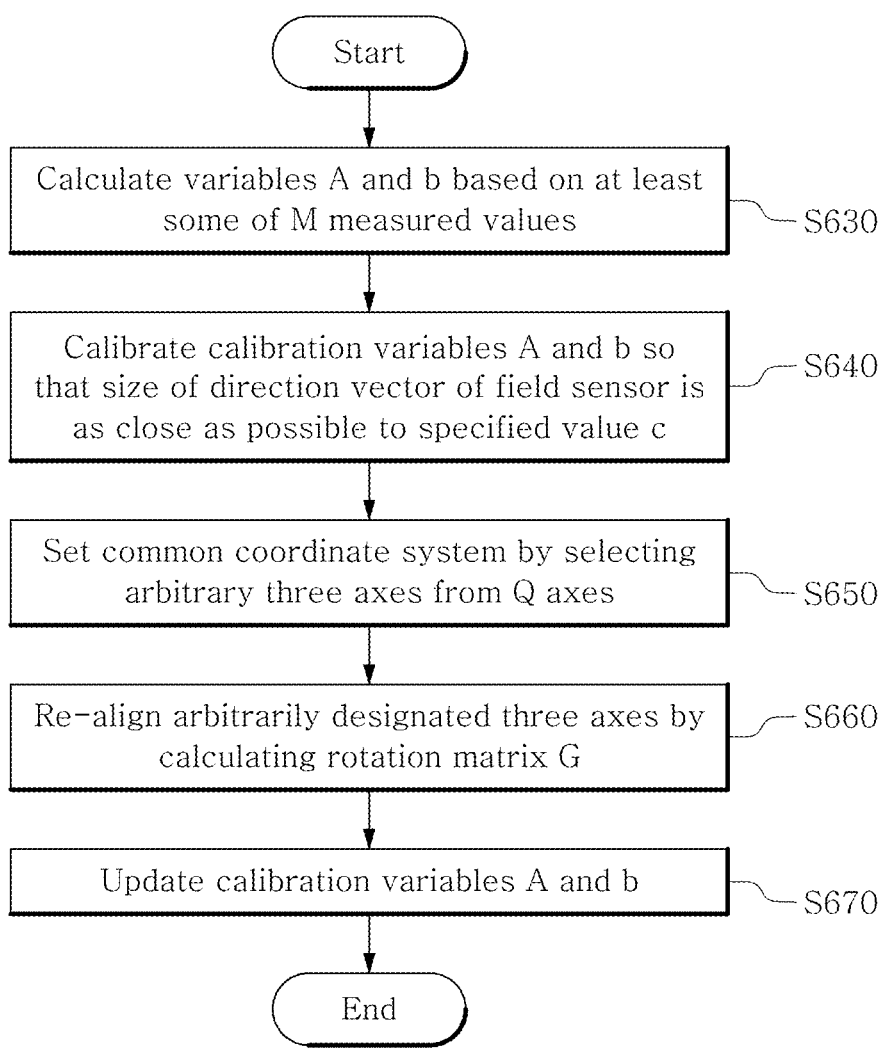
FIG. 6 is a flowchart of a process of calibrating a sensor frame of each field sensor in a second type of sensor group according to an embodiment of the present invention.

FIG. 6 is a flowchart of a process of calibrating a sensor frame of each field sensor in a second type of sensor group according to an embodiment of the present invention.

When a second type of sensor group is attached to a rigid body, that is, when one three-dimensional field sensor having skewed Q sensing axes is fixed to the rigid body, a sensor coordinate system orthogonal to the surface of the rigid body may be arbitrarily defined by a user. The calibration variables of step S2 in the second type of sensor group include A and b.

Since the sensor group consists of one sensor, a common coordinate system may be set the same as a sensor coordinate system. Then, a measured value is obtained by a single field sensor in the second type of sensor group (S1). When the measurement is repeated M times, M measured values are obtained (S1).

A measured value $y_j \in \mathbb{R}^Q$ vector of the field sensor obtained in the j-th measurement and a three-dimensional field vector $\hat{x}_j \in \mathbb{R}^3$ expressed based on the common coordinate system have the relationship of Equation 6 below.

$$y_j = A\hat{x}_j + b \quad \text{[Equation 6]}$$

If there are Q sensing axes of a field sensor that detects a three-dimensional field vector, in Equation 6, they are $\hat{x}_j \in \mathbb{R}^3$, $b \in \mathbb{R}^Q$, and $A \in \mathbb{R}^{Q \times 3}$. Here, x̂ is a vector representing a three-dimensional field vector based on a common coordinate system at a j-th time step.

Equation 6 above may be converted to Equation 7 below.

$$\begin{bmatrix} y_{1,j} \\ \vdots \\ y_{Q,j} \end{bmatrix} = :y_j = \begin{bmatrix} a_1^T \\ \vdots \\ a_Q^T \end{bmatrix} \hat{x}_j + \begin{bmatrix} b_1 \\ \vdots \\ b_Q \end{bmatrix} = :A\hat{x}_j + b \quad \text{[Equation 7]}$$

Here, $a^T$ is a transposed matrix. When the measurement is repeated M times, Equations 6 and 7 may be expressed by Equation 8 below.

$$\begin{bmatrix} y_{1,1} & \cdots & y_{1,n} \\ \vdots & \ddots & \vdots \\ y_{Q,1} & \cdots & y_{Q,n} \end{bmatrix} = :Y = \begin{bmatrix} a_1^T \\ \vdots \\ a_Q^T \end{bmatrix} [\hat{x}_1 \ \cdots \ \hat{x}_n] + $$

$$\begin{bmatrix} b_1 \\ \vdots \\ b_Q \end{bmatrix} = :A\hat{X} + b = [Ab]\begin{bmatrix} \hat{X} \\ 1^T \end{bmatrix} \quad \text{[Equation 8]}$$

In Equation 8, if the constraints of a matrix A are given while a matrix Y is given, the matrix A and the vector b may be calculated (S2).

Referring to FIG. 6, the calibrating (S2) of the sensor frame of at least one field sensor using at least some of the measured values includes, when the second type of sensor group is attached to the rigid body, calibrating the sensor frame of each field sensor in the second type of sensor group. In step S2, a calibration variable for each field sensor in the second type of sensor group is calculated.

Step S2 includes calculating a calibration variable A of the field sensor and an intrinsic variable b of the corresponding field sensor (S630). The variables A and b are calculated in a matrix form based on at least some of the M measured values measured by a single field sensor.

A measurement matrix Y of a Q-axis field sensor may be expressed by Equation 9 below.

$$Y = AX + b1^T = [A\,b]\begin{bmatrix} X \\ 1^T \end{bmatrix} \quad \text{[Equation 9]}$$

In an embodiment, multiple variables including matrices A and b may be calculated by applying a matrix decomposition algorithm to Equation 9 (S630).

The matrix decomposition algorithm is an algorithm that decomposes the measurement matrix Y into two rank-4 matrices that are most closely expressed.

The matrix decomposition algorithm includes, for example, a singular value decomposition (SVD) technique based on Eckart-Young-Mirsky theorem, various PCA techniques, or a nonlinear optimization technique using a random initial value, but is not limited thereto.

For example, USVT is calculated by applying singular value decomposition (SVD) based on Eckart-Young-Mirsky theorem to Y in Equation 9. Here, S is a diagonal matrix and has a singular value. In the obtained S, except for first four singular values, the remaining components are designated as 0 to obtain a rank-4 matrix S4. The obtained rank-4 matrix $S_4$ is used to decompose the measurement matrix Y into two optimal rank-4 matrices as shown in the following Equation.

$$Y \leftarrow US_4V^T = [Ab]\begin{bmatrix} X \\ t^T \end{bmatrix} \qquad \text{[Equation 10]}$$

Through step S630, the values of the variables A and b are simultaneously estimated.

In one embodiment, step (S630) of estimating the variables A and b through decomposition of the rank-4 matrix includes applying a transformation matrix for changing each element of a variable t to 1 at the maximum. The initial values of the variables A and b are estimated through Equation 10 by rank-4 matrix decomposition, and the variables A and b are adjusted based on the values to which the transformation matrix h is applied.

In a solution calculated by the factorization of Equation 9, a constraint that the variable t has to be a 1-vector to have a physical meaning is required. The transformation matrix h that converts each component of the variable t to 1 at the maximum is expressed by the following Equation.

$$h^T \begin{bmatrix} X \\ t^T \end{bmatrix} = 1^T \Longrightarrow h^T = 1^T \begin{bmatrix} X \\ t^T \end{bmatrix}^T \left( \begin{bmatrix} X \\ t^T \end{bmatrix} \begin{bmatrix} X \\ t^T \end{bmatrix}^T \right)^{-1} \qquad \text{[Equation 11]}$$

Here, h is a four-dimensional vector. The variable h is formed from some or all components of $$\begin{bmatrix} X \\ t^T \end{bmatrix}.$$

For example, the transformation matrix h is formed from all components, or formed by randomly sampling four or more columns (i.e., measurement points).

As a result of applying this transformation matrix, Equation 10 is changed as follows.

$$\begin{bmatrix} X \\ t^T \end{bmatrix} \leftarrow \begin{bmatrix} 1 & 0 \\ h^T & 1 \end{bmatrix} \begin{bmatrix} X \\ t^T \end{bmatrix} \qquad \text{[Equation 12]}$$

$$[A\,b] \leftarrow [Ab] \begin{bmatrix} I & 0 \\ h^T & 1 \end{bmatrix}^{-1} \qquad \text{[Equation 13]}$$

Variables A and b resulting from the application result of the rank-4 matrix decomposition algorithm are adjusted to new values through Equations 12 and 13.

Further, step S2 includes calibrating the variables A and b so that the size of a direction vector X of the field sensor is as close as possible to the size c of the unit vector in the sensor frame including the variables A and b obtained in step S630 (S640). The values of the variables A and b are calibrated from the values of steps S610 and S630 to the values of step S640.

In an embodiment, the variables A and b may be updated by calculating a matrix H that makes the size of each column vector of X is as close as possible to the size c of the unit vector (S640). For example, when the size of the unit vector is designated as 1, the size of each inverse vector of X is changed to be close to 1. For reference, the changing of the size of the column vector of X to be close to 1 in step S640 is separate from changing the component of the variable t to be close to 1 in step S630.

The matrix H that makes the size of each column vector of X is as close as possible to a specified value c (e.g., 1) is a 4×4 calibration matrix.

Optionally, $\hat{x}$ is calculated by removing the outlier components from the M measured values and applying an ellipsoid fitting algorithm to the measured values of the inlier components. In the process of calculating the unit vector $\hat{x}$, variables K (or P) and b are obtained together.

The relationship between the variables K (or P) and b and the calibration matrix H is defined by Equation 14 below.

$$H^{-1} = \begin{bmatrix} K & b \\ 0^T & 1 \end{bmatrix} \qquad \text{[Equation 14]}$$

The calibration matrix H is obtained based on Equation 10. By the obtained calibration matrix H, the variables A and b in steps S610 and S630 are updated through the following Equations 15 and 16, and eventually, the size of the direction vector X is calibrated to be a specified value c (e.g., 1) as much as possible.

$$\begin{bmatrix} \hat{X} \\ 1^T \end{bmatrix} \leftarrow H \begin{bmatrix} X \\ 1^T \end{bmatrix} \qquad \text{[Equation 15]}$$

$$[Ab] \leftarrow [Ab]H^{-1} \qquad \text{[Equation 16]}$$

Through steps S610 to S640, the sensor frame of the field sensor in the second type of sensor group is self-calibrated to a common coordinate system.

Optionally, the method may further include setting a common coordinate system by selecting any three axes from Q axes (S650).

The common coordinate system is set by arbitrarily designating three rows in the matrix A. The three arbitrarily designated rows correspond to the three-dimensional axis.

In addition, the method may further include re-aligning three arbitrarily designated axes by calculating the rotation matrix G (S660). For example, rows designated as three axes are aligned to be continuous in a matrix (S660). Then, the matrix A may be re-aligned to include a portion satisfying Equation 2 or 3 (S660).

The re-aligning (S660) may include: calculating a rotation matrix G based on the form of a submatrix of the matrix A; and updating the matrix A based on the rotation matrix G.

This rotation matrix G for updating the matrix A and $\hat{x}$ is calculated based on the shape of the submatrix of the matrix A. The rotation matrix G makes the matrix A to have the form of Equation 17 or 18.

In an embodiment, some of the submatrices of the matrix A may include a KR form represented by Equation 2 above. In this case, the matrix A is expressed by the following Equation 17.

$$A = \begin{bmatrix} K \\ B \end{bmatrix} R \qquad \text{[Equation 17]}$$

Here, the matrix A has the form of $B \in \mathbb{R}^{(n-3) \times 3}$.

In another embodiment, some of the submatrices of the matrix A may include a KR form represented by Equation 3 above. In this case, the matrix A is expressed by the following Equation 18.

$$A = \begin{bmatrix} P \\ B \end{bmatrix} R \qquad \text{[Equation 18]}$$

Here, the matrix A has the form of B∈ $\mathbb{R}^{(n-3)\times 3}$.

The rotation matrix G is a relative rotation matrix between the sensor in the second type of sensor group and the rigid body. Since the sensor group consists of a single sensor, the rotation matrix G may be an absolute rotation matrix as well as a relative rotation matrix.

The process of calculating the rotation matrix G is similar to the process of calculating the rotation matrix R in step S520 based on the Wahba problem, and thus a detailed description thereof will be omitted.

When the matrix A in step S640 is updated through Equation 19 below, a new matrix A that satisfies Equation 2 or 3 is obtained during re-alignment (S660).

$$A \leftarrow AG \qquad \text{[Equation 19]}$$

In step S660, the matrix $\hat{x}$ may also be updated through Equation 20.

$$\hat{X} \leftarrow G^T \hat{X} \qquad \text{[Equation 20]}$$

The sensor frame of the field sensor in the second type of sensor group may be self-calibrated by using the variables A and b of step S630, S640, or S660 as the calibration variable of the sensor frame in the second type of sensor group.

Optionally, step S2 may further include updating the calibration variables A and b of the field sensor to obtain a sensor frame robust against disturbance (S670). The calibration variables A and b updated through step S630, S640 or S660 may be re-updated (S670).

The calibration variables A and b are updated robustly against disturbance through an optimization method that minimizes an error (or distance) between a predicted value by the sensor frame of the previous step S630, S640, or S660 (S670) and an actual measured value.

In one embodiment, new calibration variables A and b to be updated may be calculated through Equation 21 below.

$$\min \sum_{(i,j)\in\Omega} \rho(\|A_i \hat{x}_j + b_i - y_{ij}\|^2) \text{ s.t. } \|\hat{x}_j\| = c \forall j \qquad \text{[Equation 21]}$$

Here, the sum of the differences between the predicted values and the measured values is performed for N field sensors in the sensor group.

When solving a nonlinear optimization problem such as Equation 21, a manifold optimization algorithm, a spherical manifold optimization algorithm, and a constraint optimization ((Augmented) Lagrangian method, etc.) method may be included, and various optimization techniques may be applied.

Optionally, step S2 may further include applying the RANSAC algorithm to a sensing axis and/or a time step of an actual measured value. In this case, the variables A and b may be predicted using some of the actual measured values. When the RANSAC algorithm is applied to both Q sensing axes and M time steps (i.e., the number of measurement times), variables A and b are predicted using any three or more axes and any three or more data obtained as an application result.

It is checked whether the predicted variables A and b satisfy the measured values at the remaining sensing axes and time steps well (S670). For example, it is checked whether the error (or distance) between the measured value for each sensing axis and each time step and the expected value of the sensor frame is minimized (S670). If an error that is not minimized is obtained, the calibration variables A and b may be updated so that the error is minimized (S670). This checking process (S601 to S670) is repeated until a somewhat satisfactory solution (e.g., a solution minimizing an error) is obtained.

Even when the second type of sensor group is attached to the rigid body through the above-described step S2, the self-calibration operation robust against disturbance may be performed by removing the outlier components and/or minimizing errors while not requiring a separate measuring device or the like.

Self-Calibration of Third Type of Sensor Group

Figure 7:
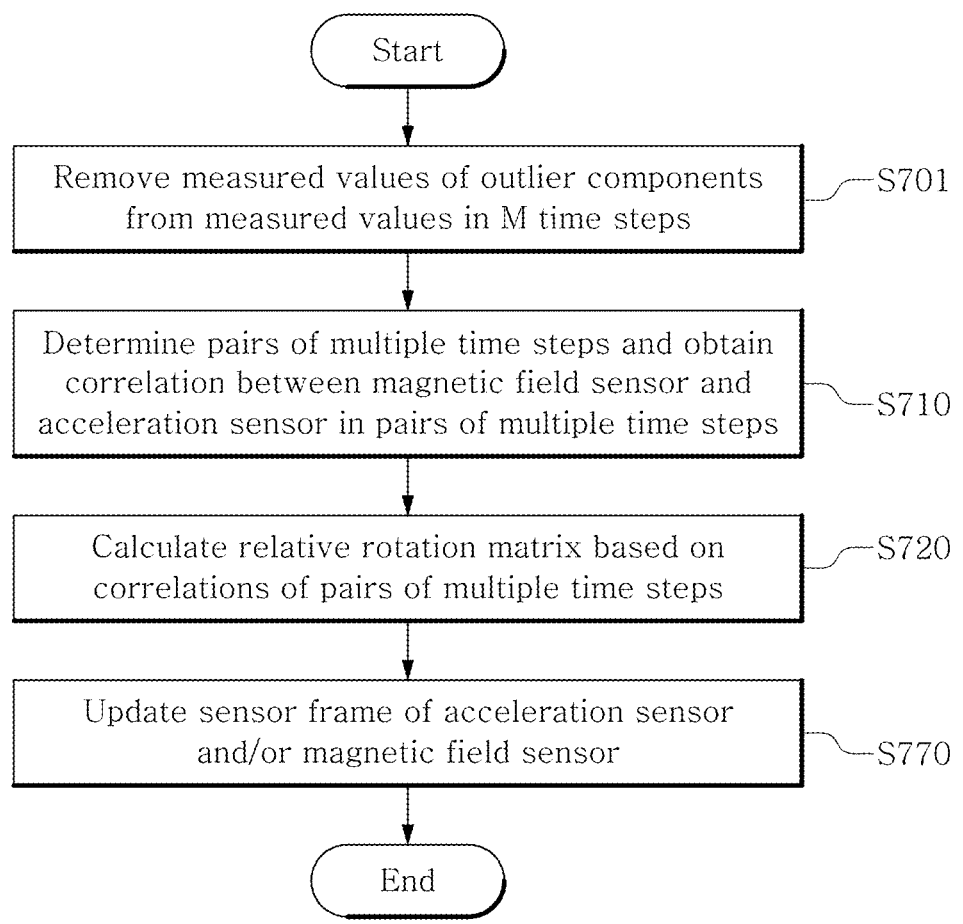
FIG. 7 is a flowchart of a process of calibrating a sensor frame of each field sensor in a third type of sensor group according to an embodiment of the present invention.

FIG. 7 is a flowchart of a process of calibrating a sensor frame of each field sensor in a third type of sensor group according to an embodiment of the present invention.

With respect to the third type of sensor group, step S2 includes calibrating the sensor frame of the first type of field sensor and the sensor frame of the second type of field sensor. The calibration variable of the third type of sensor group for calibrating the sensor frame of the first type of field sensor to the sensor frame of the second type of field sensor includes a direction from one of different three-axis field sensors to the other thereof, that is, a relative rotation matrix.

Hereinafter, for clarity of explanation, as illustrated in FIG. 4C, it will be described a process of calculating calibration variables for each field sensor in the third type of sensor group based on the third type of sensor group including the acceleration sensor and the magnetic field sensor as two different three-axis sensors.

When the third type of sensor group is attached to the rigid body, gravity and earth's magnetic field vectors are measured as two different three-dimensional field vectors (S1). Then, in step S2, a relative rotation matrix between two different three-axis field sensors fixed to the rigid body is calculated to self-calibrate different types of three-dimensional field sensors (S2). The relative rotation matrix of FIG. 7 may be a rotation matrix based on a magnetic field sensor or a rotation matrix based on an acceleration sensor. The rotation matrix based on the magnetic field sensor is expressed as $R_{m \to a}$, and the rotation matrix based on the acceleration sensor is expressed as $R_{a \to m}$. Hereinafter, for clarity of explanation, the embodiment of FIG. 7 will be described in more detail based on the rotation matrix $R_{m \to a}$ based on the magnetic field sensor.

When the third type of sensor group has been measured M times, the measured value measured at the j-th time step (i.e., a three-dimensional field vector) may be referred to as follows based on the common coordinate system:

$$\hat{g}_{a,j}^T \in \mathbb{R}^3 \text{ and } \hat{h}_{m,j} \in \mathbb{R}^3.$$

Two different three-dimensional fields, i.e., gravity and earth's magnetic field vectors are fixed to an inertial coordinate system. An inclination angle θ formed between the gravity vector g and the earth's magnetic field vector h is constant. Then, since it may be assumed that the inner product between the vectors has a constant value (e.g., cos θ or k), the following Equation 22 may be used.

$$\hat{g}_{a,j}^T R_{m \to a} \hat{h}_{m,j} = \cos \theta = k \qquad \text{[Equation 22]}$$

Here, θ is an angle between a direction of the gravity vector and a direction of the earth's magnetic field, and cos θ is a number between −1 and 1. In the related art, a value of θ was obtained using a separate measuring device. However, through the operations illustrated in FIG. 7, embodiments of the present invention may calculate a relative rotation matrix (e.g., $R_{m \to a}$) that aligns the acceleration sensor and the geomagnetic sensor without obtaining the value of θ using the measuring device. That is, the embodiments of the present invention may perform a self-calibration operation without using a separate measuring device.

Using the correlation between the first type of field sensor and the second type of field sensor based on measured values of at least some of M time steps, the sensor frame of the first type of field sensor and the sensor frame of the second type of field sensor are calibrated (S2).

Referring to FIG. 7, step S2 includes determining a pair of different time steps j and k at M time steps to obtain a correlation in the pair of time steps (S710).

The magnetic field sensor and the acceleration sensor attached to the same rigid body maintain the same correlation even if the measurement is performed multiple times. This is because the difference in direction between the gravity and the earth's magnetic field is constant.

Therefore, when the movement of the rigid body is measured M times, M measured values are obtained (S1). The M measured values are obtained by the magnetic field sensor and the acceleration sensor, respectively.

A pair of time steps is determined by selecting different time steps j and k from the M time steps (S710).

When the magnetic field vector and the acceleration vector are obtained at different time steps j and k (S1), the correlation between the magnetic field sensor and the acceleration sensor at a pair of time steps consisting of different time steps j and k may be summarized by the following Equation (S710).

$$\hat{g}_{a,j}^T R_{m \to a} \hat{h}_{m,j} - \hat{g}_{a,k}^T R_{m \to a} \hat{h}_{m,k} = 0 \quad \text{[Equation 23]}$$

When multiple time step pairs are selected, multiple Equations 23 for the selected time step pairs may be obtained (S710). A relative rotation matrix (e.g., $R_{m \to a}$) is calculated according to the number of time steps forming a pair of time steps (S710 and S720).

In one embodiment, the relative rotation matrix (e.g., $R_{m \to a}$) is calculated based on measured values in at least four time steps (S710 and S720). At least four time steps are selected from the M time steps, and at least three independent pairs of time steps is designated (S710).

When the at least three independent pairs of time steps from at least four-time steps are designated, the measured values of the at least three pairs of time steps are applied to Equation 23 to obtain at least three correlations in the pairs of time steps.

Multiple solutions of the relative rotation matrix $R_{m \to a}$ are calculated by applying a nonlinear optimization algorithm to the at least three correlations (S720). Since the relative rotation matrix (e.g., $R_{m \to a}$) may be represented by at least three variables, a solution for the variable $R_{m \to a}$ may be calculated through nonlinear optimization.

One of the multiple solutions calculated in step S720 represents an actual situation. The solution representing the actual situation is a value that best satisfies Equation 23 of the correlation. In step S720, one solution representing the actual situation among the multiple solutions is used as a value of the relative rotation matrix (e.g., $R_{m \to a}$). In another embodiment, in the relative rotation matrix (e.g., $R_{m \to a}$), at least nine time steps are selected from M time steps, and at least eight independent pairs of time steps are designated (S710).

When the at least eight independent pairs of time steps from at least nine time steps are designated, the measured values of the at least eight pairs of time steps are applied to Equation 23 to obtain at least eight correlations in the pairs of time steps.

By summarizing at least eight correlations, the following Equation 24 is obtained (S720).

$$T \text{vec}(Rm \to a) = 0 \quad \text{[Equation 24]}$$

When a matrix T is calculated based on Equation 24 above, a solution to the relative rotation matrix (e.g., $R_{m \to a}$) may be calculated (S720).

In one example, eight independent pairs of time steps from nine time steps are designated, and a correlation using the measured values at each time step pair is summarized by Equation 24. The null space of the matrix T is calculated by applying a linear transformation algorithm to the summarized Equation. This linear transformation algorithm may be, for example, direct linear transform (DLT). Then, a value of the matrix T is calculated, and when the calculated matrix T is applied to Equation 24, a solution to the relative rotation matrix (e.g., $R_{m \to a}$) may be calculated.

Meanwhile, a solution calculated as the relative rotation matrix (e.g., $R_{m \to a}$) through DLT or the like does not exist on a manifold of the relative rotation matrix (e.g., $R_{m \to a}$). Therefore, with respect to the solution obtained through the linear transformation algorithm, the nearest rotation matrix is calculated on the corresponding manifold, and the calculated nearest rotation matrix is obtained as the relative rotation matrix (e.g., $R_{m \to a}$) and used for calibration (S720). That is, the solution of the relative rotation matrix ($R_{m \to a}$) calculated through DLT or the like is used as an initial value.

After T vec ($R_{m \to a}$) described in Equation 24 is transformed again into a 3×3 linear matrix, the linear matrix is decomposed into USVT through a rank-3 matrix decomposition algorithm (e.g., singular value decomposition (SVD)). In the decomposed $USV^T$, a value of U diag ([1 1 det($UV^T$)]) $V^T$ is used as the relative rotation matrix (e.g., $R_{m \to a}$) (S720).

In another example, more than eight independent pairs of time steps from more than nine time steps are designated, and a correlation using the measured values at each time step pair is summarized by Equation 24. If a value of the matrix T obtained by calculating the null space of the matrix T by applying the linear transformation algorithm to the summarized Equation is applied to Equation 24, the solution to the relative rotation matrix (e.g., $R_{m \to a}$) may be calculated. Here, the value of the matrix T is calculated using a vector u closest to the null space, unlike the aforementioned example using the null space calculation result as it is. The vector u and the matrix T have a relationship represented by Equation 25 below.

$$\min_u \|Tu\|_2^2 \text{ s.t. } \|u\| = 1 \quad \text{[Equation 25]}$$

In Equation 25, the vector u is a unit vector.

Since the process of calculating the relative rotation matrix other than the part related to Equation 25 is the same as that in the case of eight time steps, a detailed description thereof will be omitted.

In yet another embodiment, the relative rotation matrix (e.g., $R_{m \to a}$) is calculated based on measured values in at least 17 time steps (S710 and S720). Step S720 includes calculating a variable M related to the relative rotation matrix (e.g., $R_{m \to a}$) to obtain the relative rotation matrix (e.g., $R_{m \to a}$).

When Equation 1 and Equation 2 or 3 described above are applied to Equation 23 including the relative rotation matrix (e.g., $R_{m \to a}$), Equation 19 is summarized in a form including an intrinsic variable K (or P). For example, when Equation 1 and Equation 2 are applied to Equation 23, it is summarized in the form of Equation 26.

$$(K_a^{-1}(y_{a,j} - b_a))^T R_{a \to m}(K_m^{-1}(y_{m,j} - b_m)) = \begin{bmatrix} y_{a,j} \\ 1 \end{bmatrix}^T M \begin{bmatrix} y_{m,j} \\ 1 \end{bmatrix} = \cos\theta \quad \text{[Equation 26]}$$

When Equation 21 is applied to the pair of time steps j and k, the following Equation 27 is obtained.

$$\begin{bmatrix} y_{a,j} \\ 1 \end{bmatrix}^T M \begin{bmatrix} y_{m,j} \\ 1 \end{bmatrix} - \begin{bmatrix} y_{a,k} \\ 1 \end{bmatrix}^T M \begin{bmatrix} y_{m,k} \\ 1 \end{bmatrix} = 0 \quad \text{[Equation 27]}$$

The variable M is a 4×4 matrix and a rank is 3.

At least 17 time steps are selected from M time steps, and at least 16 independent pairs of time steps are designated (S710). Since the variable M may be represented by at least 16 variables, a solution of the variable M may be calculated through nonlinear optimization (S720). The process of calculating the solution through nonlinear optimization has been described in the embodiment using at least four time steps above, and a detailed description thereof will be omitted.

In Equation 26, $K_a^{-T} R_{m \to a} K_m^{-1}$ may form a 3×3 matrix. When intrinsic variables b and K (or P) are obtained and applied to Equation 21, the relative rotation matrix (e.g., $R_{m \to a}$) may be calculated (S720). The method of calculating the intrinsic variables b and K (or P) of the three-axis field sensor has been described with reference to FIG. 5, and thus a detailed description thereof will be omitted.

Through the above-described embodiments, the relative rotation matrix (e.g., $R_{m \to a}$) may be obtained immediately by using the measured values regardless of k (i.e., cos θ). When the relative rotation matrix is calculated in this way, the sensor frame of at least one field sensor in the third type of sensor group is self-calibrated. For example, if the common coordinate system is designated as the coordinate system of the magnetic field sensor, the relative rotation matrix (e.g., $R_{m \to a}$) is applied to the sensor frame of the acceleration sensor, so that all field sensors in the third type of sensor group may be measured in the common coordinate system. For example, the sensor frame of the acceleration sensor is calibrated as illustrated in Equation 28 below.

$$A_i \hat{g}_{a,j} = b_i = A_i R_{m \to a} \hat{g}_{m,j} + b_i \quad \text{[Equation 28]}$$

Optionally, step S2 may further include removing the measured values of the outlier components by applying the RANSAC algorithm before calculating the relative rotation matrix (e.g., $R_{m \to a}$) (S701). Then, the time steps at which the measured values of the outlier components are obtained are not used to form a pair of time steps. For example, the time steps at which the measurement values of the outlier components are obtained are not included in the aforementioned 4, 9, or 13 time steps. That is, the embodiments using 4, 9, or 13 time steps may calculate the relative rotation matrix (e.g., $R_{m \to a}$) using the RANSAC algorithm as a minimal solver.

Optionally, step S2 may further include updating variables of the sensor frames of all field sensors in the third type of sensor group (S770). The variables to be updated include variables A, b, and/or R of the sensor frame. As a result of the update, an error (or distance) between the predicted value by the sensor frame including the calibration variable obtained through steps S710 and S720 and the actual measured value is robustly minimized.

In the optimization step (S770), the following conditions are used as constraints for optimization:
Constraint 1—$\hat{g}_{a,j}^T R_{m \to a} \hat{h}_{m,j} = \cos \theta$ $\forall j$
Constraint 2—Vector size in gravity direction $\|\hat{g}_{a,j}\| = c$ $\forall j$
Constraint 3—Vector size in magnetic field direction $\|\hat{h}_{m,j}\| = c$ $\forall j$ In one embodiment, new values of the variables A, b, and/or R are calculated to minimize an error between the expected value by the sensor frame of the acceleration sensor and the actual measured value, and an error between the expected value by the sensor frame of the magnetic field sensor and the actual measured value. The values of the variables A, b and/or R are updated with the calculated new values (S770).

In one example, the new values of variables A, b and/or R to be updated are calculated through Equation 29 below (S770).

$$\min \sum_{(i,j) \in \Omega_m} \rho\left(\|A_i \hat{h}_{m,j} + b_i - y_{ij}\|^2\right) + \quad \text{[Equation 29]}$$
$$\sum_{(i,j) \in \Omega_a} \rho\left(\|A_i \hat{g}_{a,j} + b_i - y_{ij}\|^2\right) \text{ s.t. } \hat{g}_{a,j}^T R_{m \to a} \hat{h}_{m,j} = \cos\theta,$$
$$\|\hat{g}_{a,j}\| = c_g, \|\hat{h}_{m,j}\| = c_h \forall j$$

Here, $\Omega m$ represents the sum of all measured values measured by the magnetic field sensor group, $\Omega a$ represents the sum of all measured values measured by the acceleration sensor group, $c_g$ represents the size of the unit vector of the acceleration sensor or force sensor, and $c_h$ represents the size of the unit vector of the magnetic field sensor.

Alternatively, the new values of variables A, b and/or R are calculated through Equation 30 below (S770).

$$\min \sum_{(i,j) \in \Omega_m} \rho\left(\|A_i \hat{h}_{m,j} + b_i - y_{ij}\|^2\right) + \quad \text{[Equation 30]}$$
$$\sum_{(i,j) \in \Omega_a} \rho\left(\|A_i R_{m \to a} \hat{g}_{m,j} + b_i - y_{ij}\|^2\right) \text{ s.t. } \hat{g}_{m,j}^T \hat{h}_{m,j} = \cos\theta,$$
$$\|\hat{g}_{a,j}\| = c_g, \|\hat{h}_{m,j}\| = c_h \forall j$$

When the sensor frame of the acceleration sensor and/or the magnetic field sensor is updated with the new value calculated through Equation 29 or 30, self-calibration is performed so that the error is minimized.

In some other embodiments, when the relative rotation matrix (e.g., $R_{m \to a}$) is calculated, it will be apparent to those skilled in the art the process of calculating the new values of the variables A and b and/or the relative rotation matrix through Equations obtained by changing the magnetic field sensor portion, such as Equation 29 and the like.

In other embodiments, other nonlinear optimization techniques may be applied to calculate new values of the variables A, b, and/or R. Here, other nonlinear optimization techniques may include, for example, a least absolute algorithm, a manifold optimization algorithm, a spherical manifold optimization algorithm, a Lagrangian method algorithm, etc., in addition to the least square algorithm such as Equations 29 and 30, but is not limited thereto.

Figure 8:
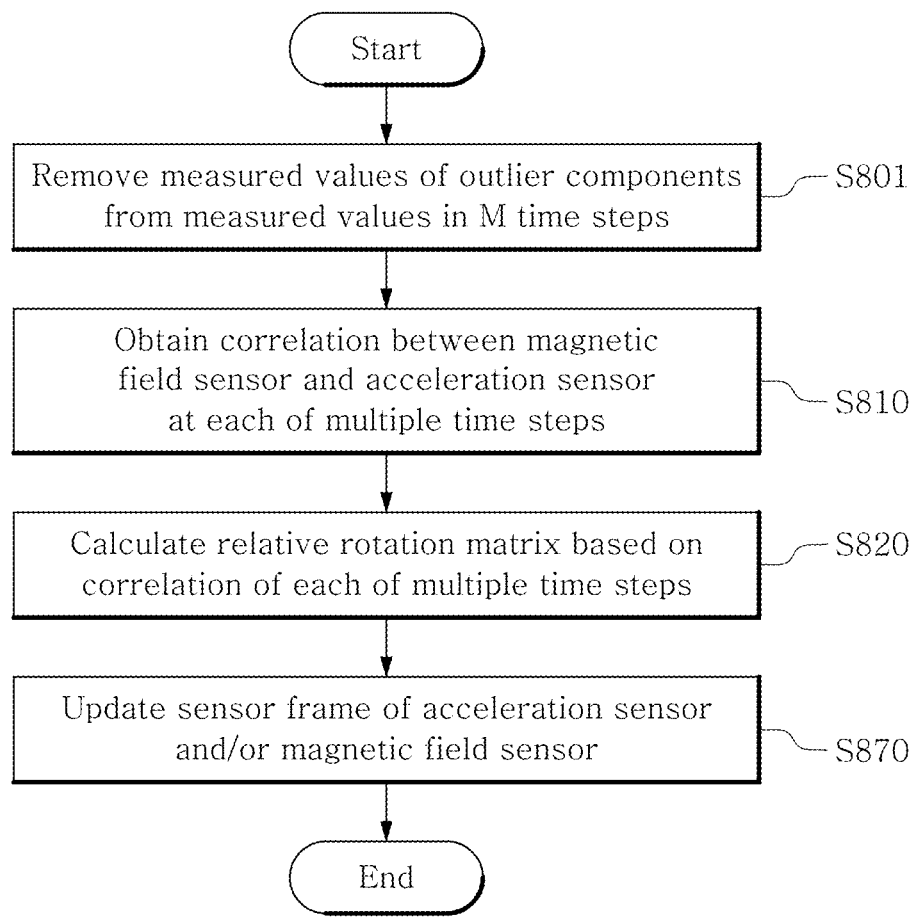
FIG. 8 is a flowchart of a process of calibrating a sensor frame of a field sensor in a third type of sensor group according to another embodiment of the present invention.

FIG. 8 is a flowchart of a process of calibrating a sensor frame of a field sensor in a third type of sensor group according to another embodiment of the present invention.

Since the embodiment of FIG. 8 is similar to the embodiment of FIG. 7, differences will be mainly described.

Referring to FIG. 8, step S2 includes, after obtaining the measured values at the M time steps (S1), obtaining a correlation for each of at least some of M time steps (S810) and calculating a relative rotation matrix based on the correlation of each time step (S820).

Based on Equation 22, the correlation between the acceleration sensor and the magnetic field sensor at a single time step j is obtained by the following Equation 31 (S810).

$$\hat{g}_{a,j}{}^T R_{m \to a} \hat{h}_{m,j} - \cos \theta = 0 \qquad \text{[Equation 31]}$$

When at least some of the M time steps are applied to Equation 31 above, correlations for each of the multiple time steps are obtained (S810).

When multiple correlations at each time step are obtained (S810), a relative rotation matrix (e.g., $R_{m \to a}$) is calculated (S820).

In one embodiment, the relative rotation matrix (e.g., $R_{m \to a}$) is calculated based on measured values in at least nine time steps (S810 and S820). Nine time steps are selected from the M time steps, and correlations at each of the at least nine time steps are obtained (S810).

When the at least nine correlations are summarized, Equation 32 below is obtained.

$$T \begin{bmatrix} vec(Rm \to a) \\ k \end{bmatrix} = 0 \qquad \text{[Equation 32]}$$

A relative rotation matrix (e.g., $R_{m \to a}$) is calculated based on Equation 32. For example, if the null space of a matrix T of Equation 32 is calculated using a linear transformation technique such as DLT, a relative rotation matrix ($R_{m \to a}$) and a solution of a variable K may be obtained immediately.

At this time, if the solution does not exist on the manifold of the relative rotation matrix ($R_{m \to a}$), a rotation matrix on the manifold closest to this solution is used for calibration. That is, the solution of the relative rotation matrix ($R_{m \to a}$) calculated through DLT or the like is used as an initial value. For example, after vec ($R_{m \to a}$) calculated through DLT is retransformed into a 3×3 linear matrix, it is decomposed to $USV^T$ using SVD, and then $UV^T$ is used as the relative rotation matrix ($R_{m \to a}$) for calibration. Since this process is similar to the embodiment of Equation 24, a detailed description thereof will be omitted.

In another embodiment, the relative rotation matrix (e.g., $R_{m \to a}$) is calculated based on measured values in at least 17 time steps (S810 and S820). 17 time steps are selected from the M time steps, and a correlation expressed as Equation 21 is obtained for each of the 17 time steps (S810).

A variable M of Equation 27 is calculated based on the correlations at the at least 17 time steps, and a relative rotation matrix (e.g., $R_{m \to a}$) is calculated through the variable M and Equation 26 (S820). The variable M calculated in step S820 is expressed by Equation 33 below.

$$\begin{bmatrix} y_{a,j} \\ 1 \end{bmatrix}^T M \begin{bmatrix} y_{m,j} \\ 1 \end{bmatrix} - \cos \theta = 0 \qquad \text{[Equation 33]}$$

From the calculated variable M, the relative rotation matrix (e.g., $R_{m \to a}$) is calculated using the fact that 3×3 matrix in Equation 21 is $K_a^{-T} R_{m \to a} K m^{-1}$ and the intrinsic variable (e.g., including K (or P)) is already known.

Since the process of step S820 is similar to the embodiment using Equations 21 and 22 above, detailed descriptions thereof will be omitted.

Optionally, step S2 of FIG. 8 may further include removing measured values of the outlier components by applying a RANSAC algorithm (S801) and/or updating the variables of all field sensors in the third type of sensor group (S870). Since steps S801 and S870 are similar to steps S701 and S770, detailed descriptions thereof will be omitted.

Through this process, the relative rotation matrix (e.g., $R_{m \to a}$) in the embodiment of FIG. 8 is calculated simultaneously with the variable k. From the variable k, θ in cos θ may be calculated. Using the relative rotation matrix (e.g., $R_{m \to a}$) obtained in step S820 or S870, different types of sensor frames (e.g., a sensor frame of an acceleration sensor and a sensor frame of a magnetic field sensor) are calibrated. The process of calibrating the sensor frames has been described through Equation 27, and detailed descriptions thereof will be omitted.

As described above, the self-calibration operation between the different types of field sensors is not limited to the rotation matrix $R_{m \to a}$ based on the magnetic field sensor. The self-calibration operation may also be performed using a rotation matrix $R_{a \to m}$ with the acceleration sensor as a reference. In this case, in Equations 22 and 31, a variable $g^T_{a,j} R_{m \to a} h_{m,j}$ is changed to a variable $h^T_{m,j} R_{a \to m} g_{a,j}$, and in other Equations, the rotation matrix ($R_{m \to a}$) is just changed to the rotation matrix ($R_{a \to m}$), and subsequent operations are the same, and thus a detailed description of the embodiment will be omitted.

Self-Calibration of Fourth Type of Sensor Group

A fourth type of sensor group including multiple field sensors attached to the rigid body may be constituted by multiple subgroups. The fourth type of sensor group may include a combination of different types of field sensors. In specific embodiments, the fourth type of sensor group has a first type, a second type and/or a third type of sensor group as a subgroup. The different types of field sensors are included in different subgroups.

In an embodiment, the fourth type of sensor group may include a combination of a three-axis field sensor and a field sensor having four or more axes. The fourth type of sensor group may include a first subgroup including the three-axis field sensor and a second subgroup including the field sensor having four or more axes. For example, the fourth type of sensor group may include a first subgroup including a three-axis force sensor and a second subgroup including an acceleration sensor having four or more axes, a first subgroup including a three-axis acceleration sensor and a second subgroup including a force sensor having four or more axes, a first subgroup including a 3-axis magnetic field sensor and a second subgroup including an acceleration sensor or a force sensor having four or more axes, or a first subgroup including the three-axis force sensor or the acceleration sensor and a second subgroup including the magnetic field sensor having four or more axes.

Further, the fourth type of sensor group may be constituted by different types of field sensors having four or more axes.

For example, the fourth type of sensor group may include force and acceleration sensors having four or more axes, force and magnetic field sensors having four or more axes, acceleration and magnetic field sensors having four or more axes, or an acceleration sensor, a force sensor, and a magnetic field sensor having four or more axes.

That is, the fourth type of sensor group includes a combination of the first type, second type and/or third type of sensor groups.

Figure 9:
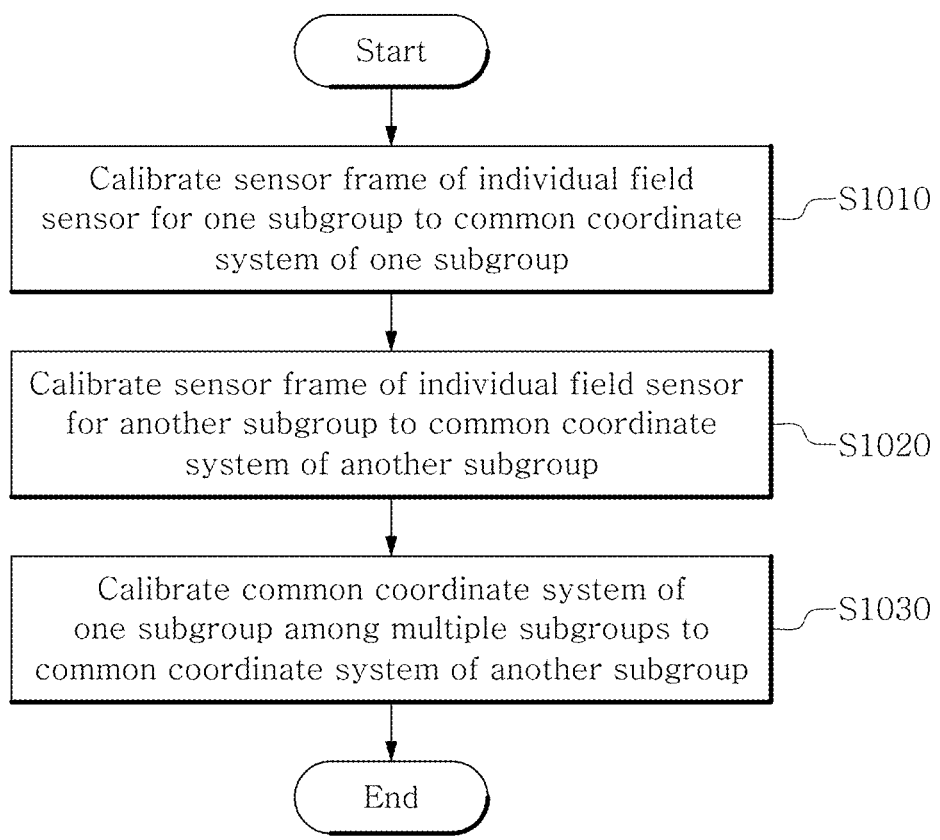
FIG. 9 is a flowchart of a self-calibration method for a fourth type of sensor group according to an embodiment of the present invention.

FIG. 9 is a flowchart of a self-calibration method for the fourth type of sensor group according to an embodiment of the present invention.

Referring to FIG. 9, the step S2 includes: calibrating a sensor frame of an individual field sensor by a common coordinate system of one subgroup for one subgroup in the fourth type sensor group (S1010); and/or calibrating the sensor frame of the individual field sensor by the common coordinate system of the other subgroup for the other subgroup in the fourth type of sensor group (S1020); and calibrating the common coordinate system of any one of the plurality of subgroups to the common coordinate system of the other subgroup (S1030). Through the process of FIG. 5 for performing self-calibration for the first type of sensor group or the process of FIG. 6 for performing self-calibration for the second type of sensor group described above in step S1010 or step S1020, the field sensor of the corresponding sensor group may be respectively calibrated to the common coordinate system of the corresponding sensor group.

For example, when the first subgroup includes the acceleration sensor having four or more axes, the first subgroup corresponds to the second type of sensor group. Then, the sensor frame of the first subgroup is calibrated to the common coordinate system of the first subgroup through the process of FIG. 6 (S1010). The calibrated sensor frame may be used as the sensor frame of the first subgroup. Further, when the second subgroup includes the force sensor having four or more axes, the second subgroup corresponds to the second type of sensor group. Then, the sensor frame is calibrated to the common coordinate system of the second subgroup through the process of FIG. 6 (S1020). The calibrated sensor frame may be used as the sensor frame of the second subgroup (S1020).

Since the first subgroup is all calibrated to the common coordinate system, the first subgroup may be treated as a single sensor. Further, since the second subgroup is all calibrated to the common coordinate system, the second subgroup may be treated as a single sensor. Since the first subgroup and the second subgroup are treated as different types of sensors, the first subgroup and the second subgroup correspond to the third type of sensor group. Then, in step S1030, the common coordinate system of the first subgroup is calibrated to the common coordinate system of the second subgroup through the process of FIG. 7 or 8.

In an embodiment, when the fourth type sensor group has a subgroup constituted by a single field sensor, the self-calibration operation for the sensor group of the corresponding field sensor may be omitted. This is because the sensor frame of the single field sensor is the sensor frame of the sensor group.

According to the embodiments described above with reference to FIGS. 2 to 9, the self-calibration method has a robust advantage in two aspects other than simply obtaining the effect of the self-calibration.

First, in the self-calibration method, the calibration variable is calculated by removing the measurement vector of the outlier component. As a result, the self-calibration method is robust against outliers that unavoidably occurs due to the surrounding environment and acceleration when calibrating with arbitrary motion.

Second, the self-calibration method does not require a large motion which is difficult to obtain measurement data. In the calibration method, even though the measurement data is obtained by rotating the field sensor through a relatively small motion, it is possible to more accurately calibrate the field sensor.

Figure 10:
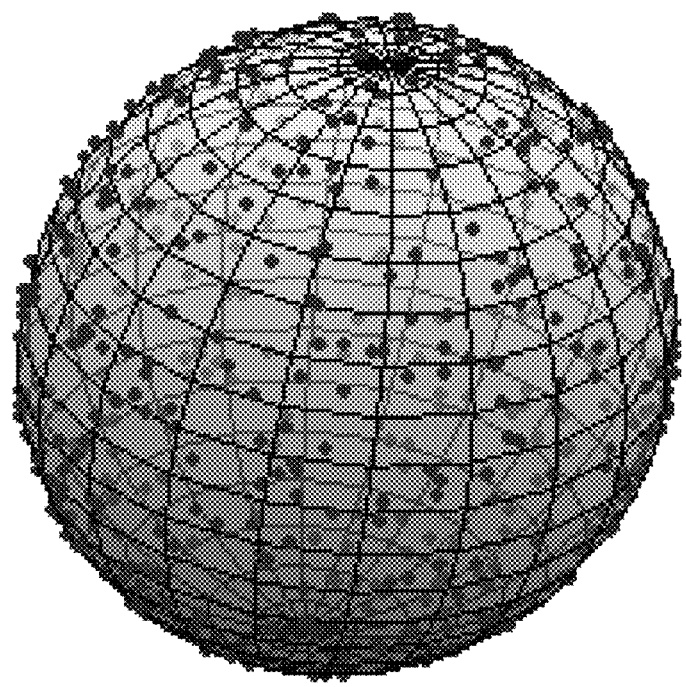
FIG. 10 is a diagram schematically visualizing a distribution of a measurement data set required for self-calibration on a sensor frame in Non-Patent Document 2.

FIG. 10 is a diagram schematically visualizing a distribution of a measurement data set required for self-calibration on a sensor frame in Non-Patent Document 2 (M. Kok and T. B. Schon, "Magnetometer calibration using inertial sensors," IEEE Sensors Journal, vol. 16, no. 14, pp. 5679-5689, 2016) and FIG. 11 is a diagram schematically visualizing a distribution of a measurement data set required for self-calibration on a sensor frame according to an embodiment of the present invention.

Figure 11:
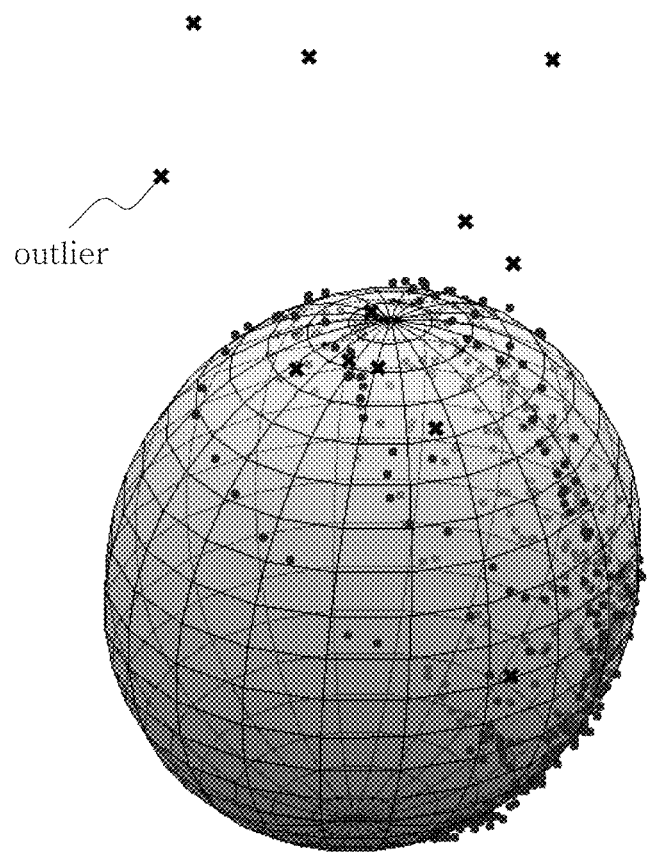
FIG. 11 is a diagram schematically visualizing a distribution of a measurement data set required for self-calibration on a sensor frame according to an embodiment of the present invention.

In FIGS. 10 and 11, the figure model models the sensor frame of the individual field sensor, and each point represents a distribution of initial measurement data for self-calibration. Outlier components of the initial measurement data are marked with an x symbol to distinguish the outlier components.

As illustrated in FIG. 10, conventionally, the individual field sensors have to be calibrated with rigid bodies or other field sensors using a measurement data set distributed entirely on a model corresponding to the sensor frame.

As such, the measurement data set distributed entirely is obtained only when a relatively large motion acts on the field sensor so that a rotational direction is rapidly changed (S1). Consequently, conventionally, there is limit that a large motion which is difficult to obtain the measurement data is required.

On the other hand, as illustrated in FIG. 11, in the embodiments of the present application, accurate self-calibration is possible when measurement data distributed locally on the model corresponding to the sensor frame is obtained (S1). The motion for obtaining the measurement data set of FIG. 11 is a small motion in which the change in rotational direction is much smaller than that of the motion of FIG. 10.

Figure 12:
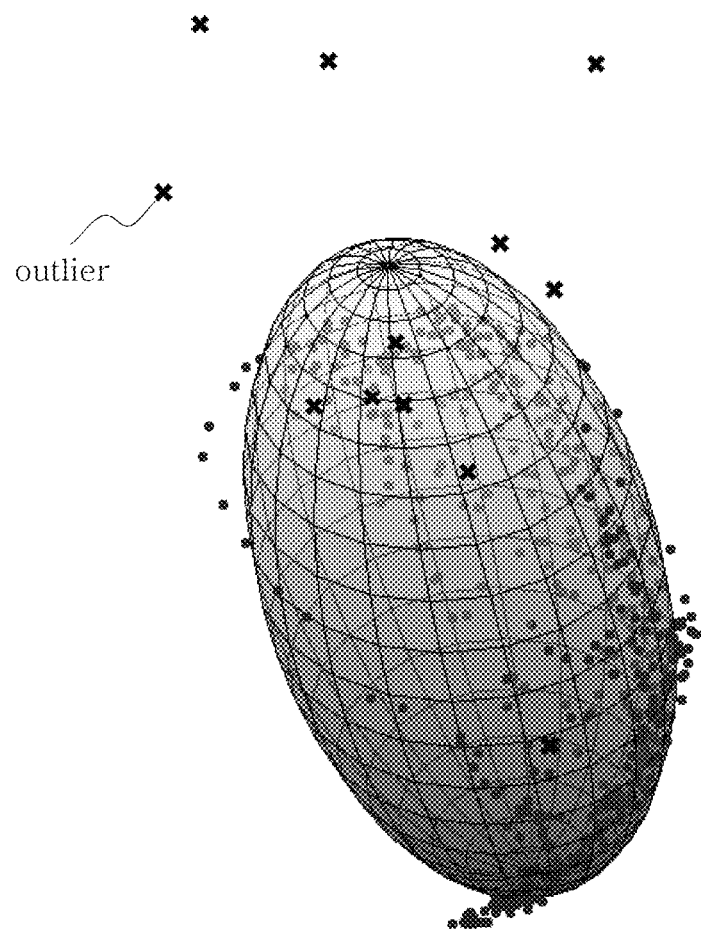
FIG. 12 is a diagram illustrating a distribution of a measurement data set when the motion of FIG. 11 is applied to the embodiment of FIG. 10.

FIG. 12 is a diagram illustrating a distribution of a measurement data set when the motion of FIG. 11 is applied to the embodiment of FIG. 10. If the relatively small motion used to obtain the measurement data set of FIG. 11 is applied to FIG. 10, the measurement data set has a distribution focused on a relatively specific area on an ellipsoid of FIG. 12.

In the conventional embodiment, accurate calibration is possible only by using the measurement data set having the distribution of FIG. 10, and accurate self-calibration may not be performed with the distribution of FIG. 12.

Meanwhile, it will be apparent to those skilled in the art that the acceleration sensor, the force sensor, or the magnetic field sensor described in the above description is an exemplary field sensor, and that the present invention is not limited thereto. The present invention may also be extended to various field sensors capable of setting a reference vector (e.g., by a physical field vector such as earth's magnetic field or gravity) for a specific type of field sensor existing in the same system.

At least some steps of the self-calibration method according to the embodiments may be performed by the system. The system may have an aspect that is entirely hardware, entirely software, or partially hardware and partially software. For example, the system may collectively refer to hardware equipped with data processing capability and operating software for driving the hardware. In this specification, terms such as "unit", "module", "device", or "system" are intended to refer to a combination of hardware and software driven by the corresponding hardware. For example, the hardware may be a data processing device including a central processing unit (CPU), a graphic processing unit (GPU), or another processor. In addition, the software may refer to an executing process, an object, an executable file, a thread of execution, a program, and the like.

The system is configured to receive data from a field sensor. Through this, the system may obtain a measured value and perform a self-calibration operation.

It will be apparent to those of skill in the art that the system may include other components not described herein. For example, the system 1 may include other hardware components required for the operations described herein, including a network interface, an input device for data entry, an output device for display, printing or other data display, and a memory for storing data.

Such a system may accurately calibrate the sensor frame of the field sensor in the sensor group with a common coordinate system that is robust to disturbances. When the sensor group is constituted by multiple field sensors, the stability of the system may be increased.

The operations of the self-calibration method and the system performing the same according to the above-described embodiments may be implemented at least partially by a computer program and then recorded in a computer-readable recording medium. For example, the operations are implemented with a program product composed of a computer-readable medium containing a program code, which may be executed by a processor for performing any or all steps, operations, or processes described above.

The computer may be a desktop computer, a laptop computer, a notebook, a smart phone, or a computing device similar thereto, or may be any device that may be integrated. The computer is a device with one or more alternative special-purpose processors, memories, storages, and networking components (either wireless or wired). The computer may execute, for example, an operating system compatible with Microsoft's Windows, Apple OS X or iOS, Linux distribution, or an operating system such as Google's Android OS.

The computer-readable recording medium includes all kinds of recording identification devices storing data which may be read by the computer. Examples of the computer-readable recording medium include a ROM, a RAM, a CD-ROM, a magnetic tape, a floppy disk, an optical data storage identification device, and the like. Further, the computer-readable recording medium may store and execute codes which are distributed in the computer system connected via a network and readable by a computer in a distribution method. In addition, functional programs, codes, and code segments for implementing the embodiments will be easily understood by those skilled in the art to which the present embodiments belong.

In the system of the present invention, when multiple field sensors having three or more sensing axes are fixed to the same rigid body, a self-calibration operation of calculating calibration variables of the field sensor only by an arbitrary motion of the rigid body without the aid of an external special device (e.g., a separate measuring device) can be performed. As a result of the self-calibration operation, the field sensor attached to the rigid body has a sensor frame consisting of calibration variables based on the common coordinate system.

In particular, when multiple field sensors outputting different types of measured values, e.g., the magnetic field sensor and the acceleration sensor (or force sensor) are attached to the same rigid body, self-calibration can be performed.

The system has a robust advantage in two aspects for the calibration of the field sensor, which the prior art does not overcome. First, the system is robust against outliers that unavoidably occur due to the surrounding environment and acceleration when calibrating with arbitrary motion.

Further, second, the system may obtain measurement data by rotating the field sensor through a relatively small motion and more accurately calibrate the field sensor with the measurement data. In other words, it is possible to perform robust and precise calibration against a motion that does not require a large motion, which is difficult to obtain the measurement data.

The effects of the present invention are not limited to the aforementioned effect, and other effects not mentioned above will be clearly understood to those skilled in the art from the description of the appended claims.

The present invention described above has been described with reference to the embodiments illustrated in the drawings, but these embodiments are just illustrative, and those of ordinary skill in the art will understand that various modifications and changes of the embodiments may be made therefrom. However, these modifications should be considered to be within the technical protection scope of the present invention. Therefore, the true technical scope of the present invention should be defined by the technical idea of the appended claims.

What is claimed is:

1. A method for self-calibrating multiple field sensors attached to a rigid body, which is performed by a processor, the method comprising the steps of:
obtaining m measured values for each field sensor by measuring with respect to a first sensor group including first type of field sensors and a second sensor group including different second type of field sensors, which are attached to the rigid body, at m time steps, wherein m is a natural number of 2 or more; and
calibrating a sensor frame of the first type of field sensor and a sensor frame of the second type of field sensor by using a correlation between the first type of field sensor and the second type of field sensor based on measured values of at least some of the m time steps.

2. The method of claim 1, wherein the calibrating of the sensor frame of the first type of field sensor and the sensor frame of the second type of field sensor comprises:
determining pairs of different time steps in the m time steps and obtaining correlations in pairs of multiple time steps; and
calculating a relative rotation matrix from one of the first and second types of field sensors to the other field sensor based on the correlations in the pairs of multiple time steps.

3. The method of claim 2, wherein in order to obtain the correlations in pairs of multiple time steps, four time steps are selected from m time steps to designate three independent pairs of time steps, and
the calculating of the relative rotation matrix comprises:
calculating multiple solutions of the relative rotation matrix by applying a nonlinear optimization algorithm to the correlations in the three pairs of time steps; and
determining one of the multiple solutions as the relative rotation matrix.

4. The method of claim 2, wherein in order to obtain the correlations in pairs of multiple time steps, nine time steps are selected from m time steps to designate eight independent pairs of time steps, and
the calculating of the relative rotation matrix comprises:
calculating a matrix T through the following Equation 1, which is obtained from the correlations in the eight pairs of time steps; and
calculating a solution of the relative rotation matrix based on the calculated value of the matrix T, $$T\text{vec}(Rm{\rightarrow}a)=0$$

or $$T\text{vec}(Ra{\rightarrow}m)=0 \quad \text{Equation 1}$$

wherein, $R_{m \to a}$ represents a relative rotation matrix based on the sensor frame of the first sensor group, and $R_{m \to a}$ represents a relative rotation matrix based on the sensor frame of the second sensor group.

5. The method of claim 2, wherein in order to obtain the correlations in pairs of multiple time steps, 17 time steps are selected from m time steps to designate 16 independent pairs of time steps, and
the calculating of the relative rotation matrix comprises:
calculating a variable M associated with a relative rotation matrix by applying measured values in the 16 pairs of time steps to the following Equation 2; and
obtaining the relative rotation matrix based on the variable M, $$\left(K_a^{-1}(y_{a,j}-b_a)\right)^T R_{m \to a}\left(K_m^{-1}(y_{m,j}-b_m)\right) = \quad \text{Equation 2}$$

$$\begin{bmatrix} y_{a,j} \\ 1 \end{bmatrix}^T M \begin{bmatrix} y_{m,j} \\ 1 \end{bmatrix} = \cos\theta, \text{ or}$$

$$\left(K_a^{-1}(y_{a,j}-b_a)\right)^T R_{a \to m}\left(K_m^{-1}(y_{m,j}-b_m)\right) =$$

$$\begin{bmatrix} y_{a,j} \\ 1 \end{bmatrix}^T M \begin{bmatrix} y_{m,j} \\ 1 \end{bmatrix} = \cos\theta$$

wherein, ya represents a measured value of the field sensor of the second sensor group, ym represents a measured value of the field sensor of the first sensor group, j and k represent different time steps, Km represents an intrinsic variable of the field sensor of the first sensor group, Ka represents an intrinsic variable of the field sensor of the second sensor group, and η represents an angle between a field vector direction of the first sensor group and a field vector direction of the second sensor group, respectively.

6. The method of claim 5, wherein the calculating of the variable M associated with the relative rotation matrix comprises:
calculating multiple solutions of the variable M by applying a nonlinear optimization algorithm to the correlations in the 16 pairs of time steps; and
determining one of the multiple solutions as the variable M,
wherein the variable M is expressed by the following Equation 3, $$\begin{bmatrix} y_{a,j} \\ 1 \end{bmatrix}^T M \begin{bmatrix} y_{m,j} \\ 1 \end{bmatrix} - \begin{bmatrix} y_{a,k} \\ 1 \end{bmatrix}^T M \begin{bmatrix} y_{m,k} \\ 1 \end{bmatrix} = 0. \quad \text{Equation 3}$$

7. The method of claim 2, wherein the calibrating of the sensor frame of the first type of field sensor and the sensor frame of the second type of field sensor comprises:
obtaining a correlation in each of at least some of m time steps; and
calculating a relative rotation matrix from one of the first and second types of field sensors to the other field sensor based on the correlation in each of at least some time steps,
wherein the correlation at each time step is expressed by the following Equation 4, $$\hat{g}_{a,j}^T R_{m \to a} \hat{h}_{m,j} - \cos\theta = 0$$

or $$\hat{h}_{m,j}^T R_{a \to m} \hat{g}_{a,j} - \cos\theta = 0 \quad \text{Equation 4}$$

wherein, g and h represent a field vector of the first sensor group and a field vector of the second sensor group, respectively, and η represents an angle between a field vector direction of the first sensor group and a field vector direction of the second sensor group.

8. The method of claim 7, wherein in order to obtain a correlation at each of at least some of time steps, nine time steps are selected from m time steps, and
the calculating of the relative rotation matrix comprises:
calculating a matrix T through the following Equation 5, which is obtained from the correlation in each of nine time steps; and
calculating a solution of the relative rotation matrix based on the calculated value of the matrix T, $$T \begin{bmatrix} \text{vec}(Rm \to a) \\ \cos\theta \end{bmatrix} = 0 \text{ or} \quad \text{Equation 5}$$

$$T \begin{bmatrix} \text{vec}(Ra \to m) \\ k \end{bmatrix} = 0$$

wherein, $R_{m \to a}$ represents a relative rotation matrix based on the field sensor of the first sensor group, and $R_{a \to m}$ represents a relative rotation matrix based on the field sensor of the second sensor group.

9. The method of claim 7, wherein in order to obtain a correlation at each of at least some of time steps, 17 time steps are selected from m time steps, and
the calculating of the relative rotation matrix comprises:
calculating a variable M associated with the relative rotation matrix by applying measured values in pairs of 17 time steps to the following Equation; and
obtaining the relative rotation matrix based on the variable M, $$\begin{bmatrix} y_{a,j} \\ 1 \end{bmatrix}^T M \begin{bmatrix} y_{m,j} \\ 1 \end{bmatrix} - \cos\theta = 0. \quad \text{Equation 6}$$

10. The method of claim 9, further comprising:
removing measured values of outlier components,
wherein a time step at which measured values of inlier components are measured is used to obtain the correlation.

11. The method of claim 2, further comprising:
updating variables of sensor frames of the multiple field sensors to minimize a difference between an expected value of the sensor frame based on the relative rotation matrix and an actual measured value.

12. The method of claim 11, wherein a new value of the variable to be updated is calculated through the following Equation 7, $$\min \sum_{(i,j)\in\Omega_m} \rho\left(\|A_i\hat{h}_{m,j} + b_i - y_{ij}\|^2\right) +$$

$$\sum_{(i,j)\in\Omega_a} \rho\left(\|A_i\hat{g}_{a,j} + b_i - y_{ij}\|^2\right) \text{ s.t. } \hat{g}_{a,j}^T R_{m\to a}\hat{h}_{m,j} = \cos\theta,$$

$$\|\hat{g}_{a,j}\| = c_g, \|\hat{h}_{m,j}\| = c_h \forall j, \text{ or}$$

$$\min \sum_{(i,j)\in\Omega_m} \rho\left(\|A_i\hat{h}_{m,j} + b_i - y_{ij}\|^2\right) +$$

$$\sum_{(i,j)\in\Omega_a} \rho\left(\|A_i\hat{g}_{a,j} + b_i - y_{ij}\|^2\right) \text{ s.t. } \hat{h}_{m,j}^T R_{a\to m}\hat{g}_{a,j} = \cos\theta,$$

$$\|\hat{g}_{a,j}\| = c_g, \|\hat{h}_{m,j}\| = c_h \forall j$$

Equation 7 wherein, i represents an index of the field sensor included in the corresponding sensor group, A and b represent intrinsic variables of the field sensor, g and h represent a field vectors of the first sensor group and a field vector of the second sensor group, and η represents an angle between a field vector direction of the first sensor group and a field vector direction of the second sensor group, respectively.

13. The method of claim 11, wherein a new value of the variable to be updated is calculated through a least squares algorithm, a manifold optimization algorithm, a spherical manifold optimization algorithm, or a Lagrangian method algorithm.

14. The method of claim 1, wherein the multiple field sensors include at least one of a force sensor, an acceleration sensor, and a magnetic field sensor, and a combination of the first type of field sensor and the second type of field sensor includes a three-axis magnetic field sensor and a three-axis acceleration sensor, a three-axis magnetic field sensor and a three-axis force sensor, or a three-axis force sensor and a three-axis acceleration sensor.

15. The method of claim 1, further comprising:
calculating a sensor frame of the first sensor group or the second sensor group by calibrating the sensor frame for each field sensor,
wherein the sensor frame of the first type of field sensor or the sensor frame of the second type of field sensor to be calibrated is a sensor frame of the first sensor group or the second sensor group.

16. The method of claim 15, wherein when the first sensor group or the second sensor group consists of multiple three-axis field sensors, the calculating of the sensor frame of the first sensor group or the second sensor group includes calculating calibration variables A and b for each field sensor using at least some of the m measured values to calibrate the sensor frame for each field sensor in the corresponding sensor group,
wherein the calculating of the calibration variables A and b for each field sensor comprises:
calculating multiple intrinsic variables including the calibration variable b based on at least some of the m measured values;
calculating extrinsic variables including a rotation matrix R based on at least some of the m measured values; and
calculating the calibration variable A based on the intrinsic variable and the extrinsic variable.

17. The method of claim 16, wherein the calculating of the multiple intrinsic variables comprises:
removing measured values of outlier components from the m measured values; and
calculating an intrinsic variable including the variable b based on the measured values of inlier components,
wherein the intrinsic variable includes a sub-matrix K or P of the calibration variable A that satisfies the following Equation 8, and
the intrinsic variable K is a matrix in a positive definite upper triangular form, and the intrinsic variable P is a matrix in a symmetric positive definite form.

$$A = KR$$

or $$A = PR \quad \text{Equation 8}$$

wherein, R represents the rotation matrix as an extrinsic variable of the field sensor.

18. The method of claim 16, wherein the calculating of the extrinsic variables based on at least some of the measured values comprises:
calculating a relative rotation matrix of sensor pairs by forming the sensor pairs in the sensor group to calculate a relative direction between the sensor frames in the sensor group; and
calculating an absolute rotation matrix for each field sensor to calculate each absolute direction of each sensor frame of an individual sensor in the sensor group, wherein the absolute rotation matrix is an extrinsic variable R.

19. The method of claim 15, wherein when the first sensor group or the second sensor group consists of field sensors having Q axes, wherein Q is a natural number of 4 or more, the calculating of the sensor frame of the first sensor group or the second sensor group includes calculating calibration variables A and b for each field sensor using at least some of the m measured values to calibrate the sensor frame for each field sensor in the corresponding sensor group,
wherein the calculating of the calibration variables A and b for each field sensor comprises:
obtaining a vector b as an intrinsic variable;
calculating a matrix A by applying a rank-4 matrix decomposition algorithm to a measurement matrix Y consisting of the measured values; and
calibrating the obtained variables A and b values so that the size of a direction vector is as close as possible to a specified value c in the sensor frame including the obtained variables A and b,
wherein the vector b is designated as an arbitrary vector, and the value c is a size value of a unit vector of the direction vector of the field sensor.

20. A computer-readable recording medium having a computer program recorded thereon, the computer program execatable by a processor to cause the processor:
to obtain m measured values for each field sensor by measuring with respect to a first sensor group including first type of field sensors and a second sensor group including different second type of field sensors, which are attached to a rigid body, at m time steps, wherein m is a natural number of 2 or more; and
to calibrate a sensor frame of the first type of field sensor and a sensor frame of the second type of field sensor by using a correlation between the first type of field sensor and the second type of field sensor based on measured values of at least some of the m time steps.

21. A system comprising:

multiple field sensors outputting m measured values by measuring the measured values at m time steps and including a first type of field sensor and a different second type of field sensor which are attached to rigid bodies, wherein m is a natural number of 2 or more; and a computing device including a processor configured to obtain m measured values from each of the multiple field sensors and to calibrate a sensor frame of the first type of field sensor and a sensor frame of the second type of field sensor using a correlation between the first type of field sensor and the second type of field sensor.

* * * * *